United States Patent
Wang et al.

(10) Patent No.: US 11,429,083 B2
(45) Date of Patent: Aug. 30, 2022

(54) METHOD AND APPARATUS FOR MODELING AND DESIGNING MULTI-DIMENSIONAL CELLULAR STRUCTURES FOR ADDITIVE MANUFACTURING

(71) Applicant: The Hong Kong University of Science and Technology, Hong Kong (CN)

(72) Inventors: Michael Yu Wang, Hong Kong (CN); Yiqiang Wang, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 271 days.

(21) Appl. No.: 16/646,138

(22) PCT Filed: Aug. 10, 2018

(86) PCT No.: PCT/CN2018/099961
§ 371 (c)(1),
(2) Date: Mar. 10, 2020

(87) PCT Pub. No.: WO2019/062346
PCT Pub. Date: Apr. 4, 2019

(65) Prior Publication Data
US 2020/0272131 A1    Aug. 27, 2020

Related U.S. Application Data
(60) Provisional application No. 62/606,512, filed on Sep. 27, 2017.

(51) Int. Cl.
*G05B 19/4099* (2006.01)
*B33Y 50/00* (2015.01)
(Continued)

(52) U.S. Cl.
CPC ........ *G05B 19/4099* (2013.01); *B29C 64/386* (2017.08); *B33Y 50/00* (2014.12);
(Continued)

(58) Field of Classification Search
CPC ........ B33Y 50/00; B29C 64/386; G06F 30/17
See application file for complete search history.

(56) References Cited

U.S. PATENT DOCUMENTS 9,902,114 B2 * 2/2018 Musuvathy ............. G06F 30/17
2002/0082779 A1 * 6/2002 Ascenzi ................. G09B 23/30
702/19

(Continued)

FOREIGN PATENT DOCUMENTS

CN    105900145 A    8/2016
CN    107111895 A    8/2017
(Continued)

OTHER PUBLICATIONS

Cai et al., "A control approach for pore size distribution in the bone scaffold based on the hexahedral mesh refinement", Computer-Aided Design 40, 2008, pp. 1040-1050.
(Continued)

*Primary Examiner* — David T Welch
(74) *Attorney, Agent, or Firm* — Amin, Turocy & Watson, LLP

(57) ABSTRACT

Modeling, constructing, and designing conformal cellular structures with spatially variable and graded microstructures that have full geometric continuity is disclosed, which includes defining a global structural domain, where the microstructures are generated for a global mesh, defining a unit structure as a base cell using a level set function, which allows for beams, trusses, shells, and solids, transforming and mapping the base cell into each element of the global mesh using an isoparametric transformation, which creates
(Continued)

a conformal cellular structure in accordance with a set of requirements on distribution of material and/or mechanical properties, and applying a global cutting function to guarantee geometric continuity in connections on the common face of any two neighboring cells of the structure. As a result, more complex geometric shapes and features can be generated at the cell level, while maintaining the specified geometric connectivity across the cells of the structure.

20 Claims, 25 Drawing Sheets

(51) Int. Cl.
*B29C 64/386* (2017.01)
*G06F 30/17* (2020.01)
*G06T 17/05* (2011.01)

(52) U.S. Cl.
CPC .............. *G06F 30/17* (2020.01); *G06T 17/05* (2013.01); *G05B 2219/35134* (2013.01); *G05B 2219/49023* (2013.01)

(56) References Cited

U.S. PATENT DOCUMENTS

| | | | |
|---|---|---|---|
| 2014/0324204 A1* | 10/2014 | Vidimce | B33Y 50/00 700/98 |
| 2015/0190971 A1 | 7/2015 | Musuvathy et al. | |
| 2015/0193559 A1 | 7/2015 | Musuvathy | |
| 2015/0367578 A1 | 12/2015 | Arisoy et al. | |
| 2016/0096318 A1 | 4/2016 | Bickel et al. | |
| 2016/0321384 A1* | 11/2016 | Pal | B33Y 30/00 |
| 2017/0069127 A1* | 3/2017 | Umetani | G06T 17/00 |
| 2017/0083003 A1 | 3/2017 | Arisoy et al. | |
| 2017/0329878 A1 | 11/2017 | Gondek et al. | |
| 2018/0307209 A1* | 10/2018 | Chin | B22F 1/10 |
| 2019/0026415 A1* | 1/2019 | Han | B33Y 50/02 |
| 2020/0150624 A1* | 5/2020 | Marinov | G06F 30/10 |

FOREIGN PATENT DOCUMENTS

| | | |
|---|---|---|
| WO | 2004/093657 A1 | 11/2004 |
| WO | 2014/160389 A1 | 10/2014 |
| WO | 2015/106020 A1 | 7/2015 |
| WO | 2015/185702 A1 | 12/2015 |

OTHER PUBLICATIONS

Aremu et al., "A voxel-based method of constructing and skinning conformal and functionally graded lattice structures suitable for additive manufacturing", Additive Manufacturing 13, 2017, 13 pages.
Wang et al., "Concurrent design with connectable graded microstructures", Comput. Methods Appl. Mech. Engrg. 317, 2017, pp. 84-101.
Andreassen et al., "Design of manufacturable 3D extremal elastic microstructure", Mechanics of Materials 69, 2014, 10 pages.
Schumacher et al., "Microstructures to Control Elasticity in 3D Printing", Cornell University, ACTM Trans. Graph. 2015, 13 pages.
Fryazinov et al., "Multi-scale space-variant FRep cellular structures", Computer-Aided Design 45, 2013, pp. 26-34.
Yoo, Dongjin, "New paradigms in internal architecture design and freeform fabrication of tissue engineering porous scaffolds" Medical Engineering & Physics 34, 2012, pp. 762-776.
Wang et al., "Topological design and additive manufacturing of porous metals for bone scaffolds and orthopaedic implants: A review", Biomaterials, 83, 2016, pp. 127-141.
Alexandersen et al.,"Topology optimisation of manufacturable microstructural details without length scale separation using a spectral coarse basis preconditioner", Comput. Methods Appl. Mech. Engrg. 290, 2015, pp. 156-182.
Zhu et al.,"Two-Scale Topology Optimization with Microstructures", arXiv:1706.03189v1, Jun. 10, 2017, 19 pages.
Wang, Yan, "Periodic surface modeling for computer aided nano design",Computer Aided Design, 39 (3), 2007, pp. 179-189.
Lorensen et al.,"Marching Cubes: A High Resolution 3D Surface Construction Algorithm", General Electric Company Corporate Research and Development Schenectady, vol. 21, No. 4, Jul. 1987, 7 pages.
My et al.,"A level set method for structural topology optimization", Computer Methods in Applied Mechanics and Engineering, 192, 2003, pp. 227-246.
Yq et al.,"Topological shape optimization of microstructural metamaterials using a level set method", Computational Materials Science, 87, 2017, pp. 178-186.
Sigmund, Ole, "A new class of extremal composites", Journal of the Mechanics and Physics of Solids, 48 Jan. 7, 1999, pp. 397-428.
Guo et al., "Explicit feature control in structural topology optimization via level set method", Comput. Methods Appl. Mech. Engrg. 272, 2014, pp. 354-378.
International Search Report for PCT Application No. PCT/CN2018/099961 dated Nov. 22, 2018, 2 pages.

* cited by examiner

METHOD AND APPARATUS FOR MODELING AND DESIGNING MULTI-DIMENSIONAL CELLULAR STRUCTURES FOR ADDITIVE MANUFACTURING

CROSS REFERENCE TO RELATED APPLICATION

This application is a U.S. National Stage filing under 35 U.S.C. § 371 of international patent cooperation treaty (PCT) application No. PCT/CN2018/099961, filed Aug. 10, 2018, and entitled "METHOD AND APPARATUS FOR MODELING AND DESIGNING MULTI-DIMENSIONAL CELLULAR STRUCTURES FOR ADDITIVE MANUFACTURING", which applications claim priority to U.S. Provisional Application No. 62/606,512, filed on Sep. 27, 2017, entitled: "Methods for Modeling and Designing Three Dimensional Cellular Structures for Additive Manufacturing." The entireties of these applications are hereby incorporated by reference herein.

TECHNICAL FIELD

The subject disclosure generally relates to structural design and additive manufacturing. For example, a technique of modeling and designing conformal cellular structures is provided where the conformal cellular structures are composed of spatially-variable and continually-connected microstructures for additive manufacturing.

BACKGROUND

Cellular structures have been defined as three-dimensional (3-D) structures composed of downscale microstructures, with geometric features that can span several dimensional orders from tens of nanometers to sub-millimeters. Cellular structures are known for superb mechanical performance, in comparison to base materials with high strength, accompanied by a relatively low mass, good energy absorption characteristics, and good thermal and acoustic insulation properties, with emerging applications in aerospace, automobile and medical industries.

The mechanical behavior of cellular structures is significantly determined not only by the base materials, but also by the geometries as well as the layout patterns of their downscale cells. Consequently, a systematic design strategy for creating cellular structures of novel shapes and patterns has sparked the interest of engineers and designers alike, as recent rapid advances in additive manufacturing offers engineers and designers great freedom for flexible fabrication of innovative cellular structures with high geometric complexity and fine details, however, conventional solutions are inadequate for a variety of reasons.

In a computer-aided design model, the cellular structures can typically be built by replacing specific regions of a solid object with prescribed cells in a designed pattern. In this regard, a goal is to adaptively adjust the microstructure cells to conform to the object's geometry, serving to enhance the object's mechanical performance.

Cellular structures with spatially-variable microstructural cells have attracted increased interest for their improved mechanical performance compared to periodically repeated cellular structures. Particularly, a class of variable cellular structures may involve similar cells, but different geometric feature shapes and sizes, also known as variable or graded cells.

Conventional systems typically have realized the purpose through an explicit parametric technique, to represent truss/beam-based or shell-like features via explicit parameters and to characterize the global variations of the microstructures via replicating functions. However, these conventional systems have severe limitations on their ability to represent variations of microstructures involving general types of internal features. As a result, the existing methods and apparatuses offer limited gains in mechanical and structural properties and performance of the achieved structural designs.

The above-described background is merely intended to provide an overview of contextual information regarding some issues with generating conforming cellular structures, and is not intended to be exhaustive. Additional context may become apparent upon review of one or more of the various non-limiting embodiments of the following detailed description.

SUMMARY

The following summary is a general overview of various embodiments disclosed herein and is not intended to be exhaustive or limiting upon the disclosed embodiments. Embodiments are better understood upon consideration of the detailed description below in conjunction with the accompanying drawings and claims.

Disclosed herein are embodiments for modeling and designing conformal cellular structures with geometrically fully connected microstructures that have variable structural properties in accordance with a specified or required spatial distribution. Using one or more of the embodiments described herein, conformal cellular structures of variable and graded microstructural cells can be modeled, constructed, and optimized, especially for additive manufacturing.

In one embodiment, an additive manufacturing device is described herein. The additive manufacturing device includes a processor, and a memory that stores executable instructions that, when executed by the processor, facilitate performance of operations to generate structure data for use to generate a spatially variable and graded cellular structure comprising any one or more of at least one of a beam, a truss, a shell, or a solid. The operations comprise, based on a base microstructure cell that adheres to a defined geometric model and a level-set function applicable to the base microstructure cell, creating base cells, wherein the level-set function facilitates a mapping of the base microstructure cell to a discrete solid object mesh. The operations further comprise discretizing a solid object domain into a corresponding conforming mesh comprising a mesh structure and applying a transformation to the base cells comprising applying an isoparametric transformation of the base cells into the corresponding conforming mesh, resulting in a set of transformed base cells.

Further, the operations comprise applying a global cutting function to the transformed base cells comprising generating continuous geometric connections between repeated instances of the set of transformed base cells within the corresponding conforming mesh. Additionally, the operations comprise determining a level-set function representation of the transformed base cells comprising structure data representative of a cellular structure of at least some the set of transformed base cells and the mesh structure of the corresponding conforming mesh and facilitating a use of, or an access to, the structure data by an additive manufacturing device to generate a spatially variable and graded cellular structure.

In an embodiment, the solid object domain can be a unit-sized three-dimensional (3-D) cube, wherein the geometric model is an implicit representation model, and wherein the corresponding conforming mesh is a body-fitted hexahedron mesh. The solid object domain can be a unit-sized two-dimensional (2-D) square, wherein the geometric model is an implicit representation model, and wherein the corresponding conforming mesh is a body-fitted quadrilateral mesh.

In another embodiment, a computer-implemented method is described herein. The computer-implemented method includes obtaining, by a system comprising a processor, a level-set function applicable to a base microstructure cell adhering to a defined geometric model, wherein the level-set function facilitates a mapping of the base microstructure cell to a discrete solid object mesh. Based on the level-set function and the base microstructure cell, base cells are created. The solid object domain is then discretized into a corresponding conforming mesh comprising a mesh structure, and a transformation is applied to the base cells comprising applying an isoparametric transformation of the base cells into the corresponding conforming mesh, resulting in transformed base cells. The computer-implemented method further includes applying a global cutting function to the transformed base cells comprising generating continuous geometric connections between repeated instances of the transformed base cells within the corresponding conforming mesh. Further, a level-set function representation of the transformed base cells is determined, the level-set function representation comprising structure data representative of a cellular structure of a group of the transformed base cells and the mesh structure of the corresponding conforming mesh. The computer-implemented method further includes facilitating a use of the structure data by an additive manufacturing device to generate a spatially variable and graded cellular structure.

In a further embodiment, a machine-readable storage medium is described herein. The machine-readable storage medium comprises executable instructions that, when executed by a processor, facilitate performance of operations. The operations can comprise creating base cells comprising applying a level-set function to a base microstructure cell that adheres to a defined geometric model, wherein the level-set function facilitates a mapping of the base microstructure cell to a discrete solid object mesh. The operations further comprise discretizing a solid object domain into a corresponding conforming mesh comprising a mesh structure and applying an isoparametric transformation of the base cells into the corresponding conforming mesh, resulting in transformed base cells.

Additionally, a global cutting function can be applied to the transformed base cells, wherein continuous geometric connections are generated between repeated instances of the transformed base cells within the corresponding conforming mesh. Also, a level-set function representation of the transformed base cells can be determined comprising structure data representative of a cellular structure of the transformed base cells and the mesh structure of the corresponding conforming mesh. Further, access to the structure data by an additive manufacturing device can be facilitated to generate a spatially variable and graded cellular structure using the structure data.

The geometric model of the base microstructure cell can be a feature-based geometric model, an implicit function-based geometric model, or a mesh-based geometric model.

These and other additional features of the disclosed subject matter are described in more detail below.

DETAILED DESCRIPTION

Figure 1:
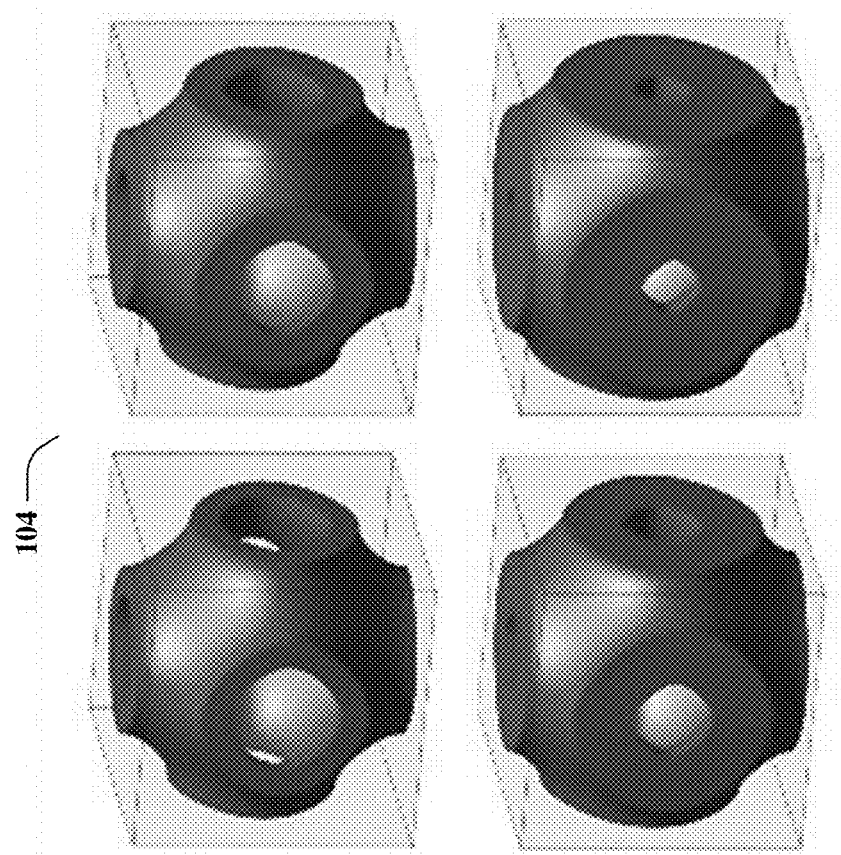
FIG. 1 represents a perspective view of a basic unit cell (left), and its family of base cells (right), in accordance with an example embodiment.
Figure 1:
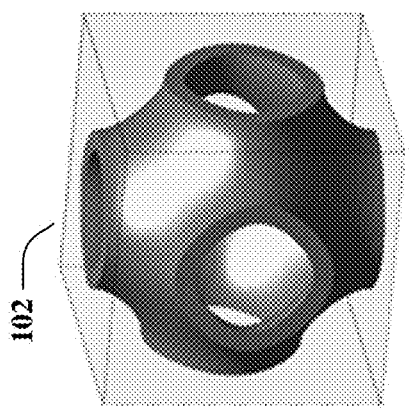

As mentioned, modeling of conformal and variable cellular structures has become a research area with growing interest for both design and fabrication processes. When designing variable cellular structures, it is a goal to guarantee the full geometric connectivity between microstructural cells. For microstructural cells lacking full geometric connectivity at the interface between neighboring cells, overhang regions and unconnected parts cannot bear external load, and they often have fabrication difficulties in additive manufacturing. Mismatched regions at the interface can cause stress concentrations and should be completely avoided in design.

A requirement of full geometric connectivity between all microstructural cells may be imposed as a set of constraints in the design process. But such an approach leads to severe restrictions on the design solution and potential difficulties in convergence. A blending operation may be carried-out as a post-process, in an attempt to improve geometric connectivity after a generation process of individual cells. Such a blending usually imposes strong restrictions on the types of microstructures and their variation gradients in the resulting cellular structures, and consequently limits the mechanical and structural properties and performance of the achieved structures.

The various embodiments herein present various methods, apparatuses, computer readable media, etc. for modeling and designing conformal cellular structures with geometrically fully connected microstructures that have variable structural properties in accordance with a specified or required spatial distribution. Using the embodiments, conformal cellular structures of variable and graded microstructural cells can be modeled, constructed, and optimized, especially for additive manufacturing.

One or more embodiments herein describe innovative techniques to design conformal and variable cellular structures using a geometric method. In this regard, a base unit cell is created, typically from an existing geometric model, represented by an implicit function, particularly a level set function—which allows the creation of typical beams and trusses, as well as general shells and solids, to map the base cells into a discrete hexahedron mesh in 3-D (or quadrilateral mesh in 2-D) of a three-dimensional solid object using isoparametric transformation, and a global "cutting function," which results in a spatially variable and graded cellular structure that allows for various geometric operations on the base cell without loss of full geometric connectivity between cells.

At a global structural scale, a solid object is discretized by a body-fitted hexahedral mesh. In this regard, a cellular structure can be built by incorporating the base cells into the corresponding elements, where the vertices of the cells are fully attached to the element nodes using an isoparametric transformation.

At a microscopic level, a replicable base cell structure is defined as a zero-level set of a level-set function that is triply periodic within a unit cell. Construction of variable microstructures is then realized by using different offset heights of the base cell level-set function or by applying cell-shaping functions to the base cell level-set function.

Since all the microstructures are taken from an identical base cell level-set function, they have full geometric connectivity; the microstructures are constructed using the "cutting" function method, which defines cut heights on the mesh nodes and then interpolates a cutting function to apply locally to the level-set function within each mesh element. Since the cut height is applied on the shared nodes and is interpolated within the mesh element, full geometric continuity is guaranteed at the face between two neighboring elements, while enabling variable regional or global geometry.

A similar approach can be used to apply various cell-shaping functions to the level-set function, which applies additional transformations, to obtain different feature shapes and sizes with variable densities and mechanical properties, and to map the different feature shapes/sizes with continuous connectivity into the global structure.

A big advantage of the various embodiments herein is that a large range of material space can be covered in the generated cellular structures, since the cellular structures are constructed via a combination of the cell-shaping functions.

The construction process of the base unit cells is completely independent from the cellular structure's generation process. Therefore, a relatively high computational efficiency can be expected.

The various embodiments consist of modeling, constructing, and designing conformal cellular structures with spatially variable and graded microstructures that have full geometric continuity. There are two structural systems, one for the microscopic cell scale and the other for global structural scale. Respectively, each system has its own coordinate system in three dimensional space $x=\{x, y, z\}$. As shown in FIG. 1, at a cell scale level, a base microstructural cell is defined as a unit cell 102, which can be characterized in terms of an implicit field representation. A family of base cells 104 can be created by taking various level-set constants on the base cell level-set function.

Figure 3A:
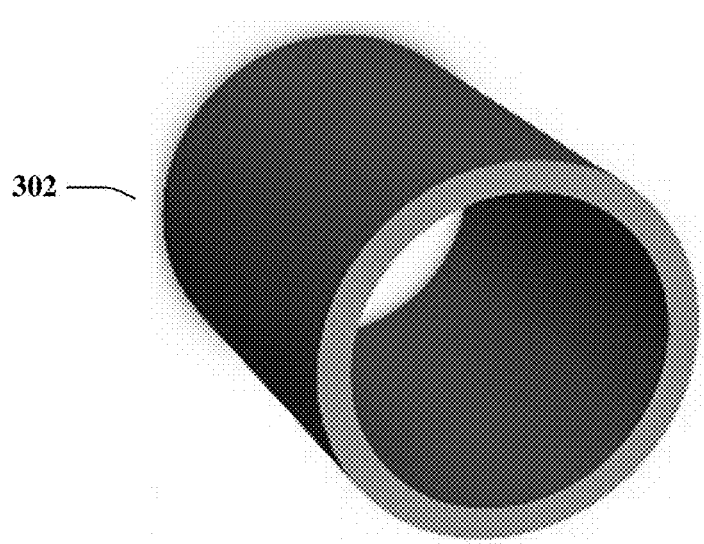
FIG. 3A represents a perspective view of a cylindrical solid and its discretization form, in accordance with an example embodiment.
Figure 3B:
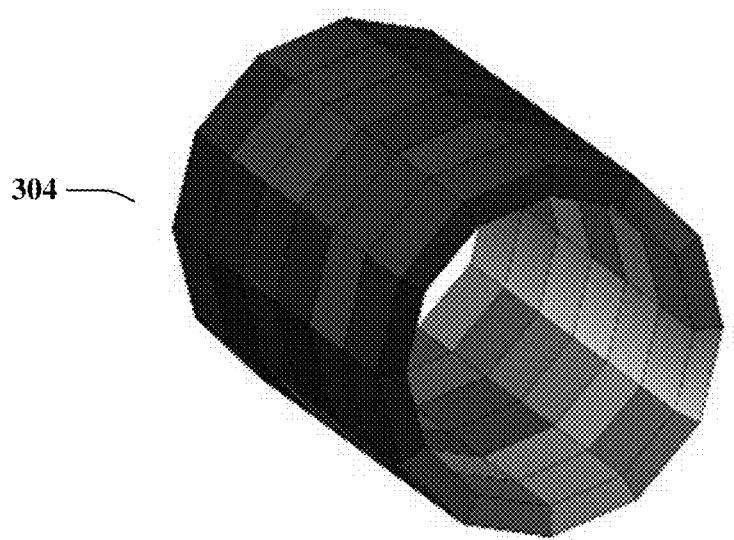
FIG. 3B represents a perspective view of the conformal cellular structure with its base cell transformed and mapped into the global mesh of the structure, in accordance with an example embodiment.
Figure 3C:
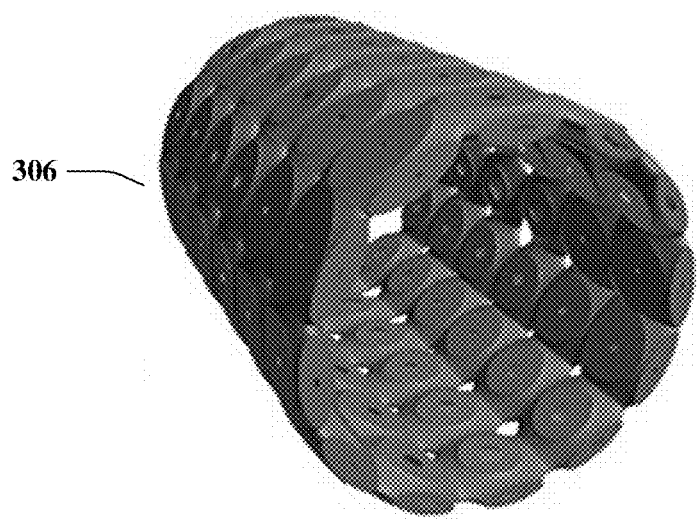
FIG. 3C represents a perspective view of a unit base cell according to FIG. 1 that is transformed and mapped into each of the hexahedron mesh elements of the cylindrical mesh solid in FIG. 3B.

At a global level, as shown in FIGS. 3A-3C, a structural domain 302 can be defined with a discrete conforming mesh, usually as hexahedrons 306 in 3-D (or quadrilaterals 304 in 2-D). The base cell is transformed and mapped into each mesh element using an isoparametric transformation, which creates a conformal cellular structure in accordance with a set of requirements on distribution of material and/or mechanical properties. Advantages are further realized by employing a global cutting function to guarantee a specified geometric continuity in connections on the common face of any two neighboring cells of the structure. For additive manufacturing, where full geometric connectivity is specified in many cases, it is characterized as being at least $C^0$ continuous between two neighboring cells on their common cell face. A higher order continuity, such as $C^1$, can also be achieved, for considerations for more desirable structural integrity, such as to reduce stress concentrations and achieve a high level of load-carrying capability. Further, geometric shaping can be developed, with a capability for generating more complex geometric shapes and features at the cell level, while maintaining a specified or required geometric connectivity across the cells of the structure. With the various embodiments herein, a user can construct and design a class of conformal cellular structures with variable and graded microstructures that may be fabricated with an additive manufacturing technique, such as product lifecycle management (PLM), plastic design and manufacturing (PDM), selecting laser sintering (SLS), selective laser melting (SLM), and others.

An example, non-limiting objective of the various embodiments herein relates to generating a base unit cell. In one or more of the various embodiments herein, an implicit representation model is used to define an implicit function $\phi(x)$, $x \in \mathbb{R}^d$, with d=2 or 3 as the spatial dimension. The implicit function is usually referred to as the level-set function, which, in one embodiment, is a single-valued scaler function. With a level-set method, the topology and geometric surface of the structural domain of the base cell is implicitly described by a level-set of the level-set function $\phi(x)$, for example, the zero-level set, which is illustrated here for convenience. That is, given a regularly-shaped unit cell $D \in \mathbb{R}^d$, the base cell is completely defined by:

$$\phi(x) \begin{cases} > 0 & \text{if } x \in U \\ = 0 & \text{if } x \in B \\ < 0 & \text{if } x \in D/(U \cup B) \end{cases} \quad (1)$$

where B and $U \subseteq D$ depict the structural boundary and the solid region of the base cell, respectively. Optionally, a unit-sized cube in 3-D (or square in 2-D) can be taken as the base cell domain, without loss of generality, $I=\{-1 \leq x \leq 1, -1 \leq y \leq 1, -1 \leq z \leq 1\}$.

For some domains, the base cell itself should be repeatable throughout the structural space. This can be realized by imposing a set of periodic conditions on the base cell level-set function, $\phi(x)=\phi(x+T)$, where T denotes the periodic intervals and equals to identity, e.g., T=I for unit-sized cells. In such case, the level-set function has an equal value on the opposite faces of the unit cell boundary box. For the general three-dimensional case, d=3, the base-cell level-set function is a triply periodic function. With this triply periodic condition, there is not any geometric discontinuity on the faces of each cell, when the base cell is repeatedly and periodically distributed among all the cells in the spatial domain D of the structure. In one embodiment, a triply periodic condition is implemented to eliminate any geometric discontinuity in the various embodiments herein to generate and develop cellular structures of variable and graded microstructural cells distributed within the structure.

The base cell level-set function could be designated as the signed distance function. That is, within the unit cell $D \in \mathbb{R}^d$ the signed distance function, as a representation of the base cell, is defined by:

$$\phi(x) = \begin{cases} dist(x; B) & \text{if } x \in U \\ 0 & \text{if } x \in B \\ -dist(x; B) & \text{if } x \in D/(U \cup B) \end{cases} \quad (2)$$

where dist(x; B) denotes the minimum Euclidean distance of point x to the boundary B.

A base cell could also be described with an analytical triply periodic function as a periodic surface model. Examples of such an analytical representation include the family of triply periodic minimal surfaces, such as the P, D, and I-WP types of the following nodal equations, to the first order of approximation:

$$P: \phi(r) = \cos(2\pi x/\lambda_x) + \cos(2\pi y/\lambda_y) + \cos(2\pi z/\lambda_z) + C = 0 \quad (3)$$

$$D: \phi(r) = \begin{Bmatrix} \cos(2\pi x/\lambda_x)\cos(2\pi y/\lambda_y)\cos(2\pi z/\lambda_z) \\ -\sin(2\pi x/\lambda_x)\sin(2\pi y/\lambda_y)\sin(2\pi z/\lambda_z) + C \end{Bmatrix} = 0$$

$$I\text{-}WP: \phi(r) =$$
$$\begin{Bmatrix} 2\cos(2\pi x/\lambda_x)\cos(2\pi y/\lambda_y) + 2\cos(2\pi y/\lambda_y)\cos(2\pi z/\lambda_z) + \\ 2\cos(2\pi z/\lambda_z)\cos(2\pi x/\lambda_x) - \\ \cos(4\pi x/\lambda_x) - \cos(4\pi y/\lambda_y) - \cos(4\pi x/\lambda_z) + C \end{Bmatrix} = 0$$

where $\lambda_k$ is the wavelength of periods and C is a constant. FIG. 1 depicts such a base unit cell 102, described with the above P type triply periodic minimal surface representation, and its family of the base unit cells 104 constructed by taking different values of constant C.

In a numerical implementation example, the base cell level-set function may take a discrete form. The cell domain is discretized by a uniform grid with element length 1. In the case of the signed distance function, the function values at the grid points are first evaluated with Eq. (2) and then a continuous approximation within each grid element is built through a trilinear (or bilinear) interpolation (or a higher order interpolation). The representation accuracy would be dependent on the resolution of the grid, and more elements would increase the capability of representing more feature details and smoother surfaces. However, a large number of elements usually leads to higher computational complexity. Therefore, a balanced resolution may balance computational accuracy and cost.

Extraction of explicit iso-surfaces from the level-set function is crucial to display structural geometries. A variety of approaches can be used to generate mesh representations of the embedded surface. An example approach that can be used in any one or more of the disclosed embodiment comprises the Marching Cubes method as a reference strategy.

Figure 2A:
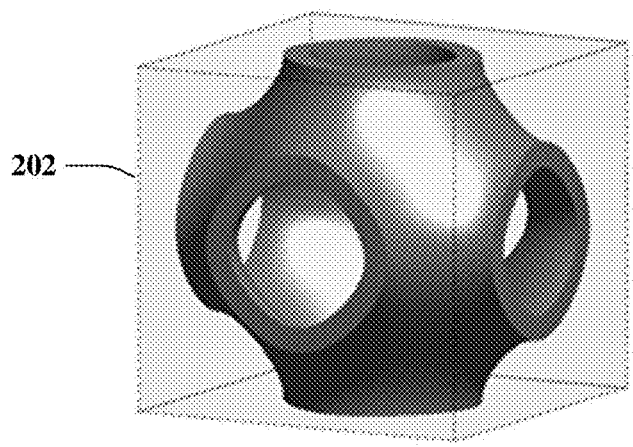
FIGS. 2A-2C represent base unit cells constructed using a level set function, in accordance with an example embodiment, with FIG. 2A representing a perspective view of a P-type minimal surface structure unit cell, FIG. 2B representing a perspective view of a BCC-type (body centered cubic) unit cell using a signed distance function, and FIG. 2C representing a perspective view of a base cell combining a BCC and a P-type structures through union operation.
Figure 2B:
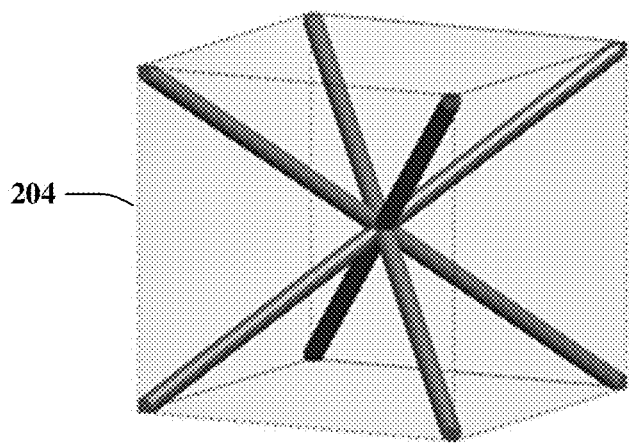
Figure 2C:
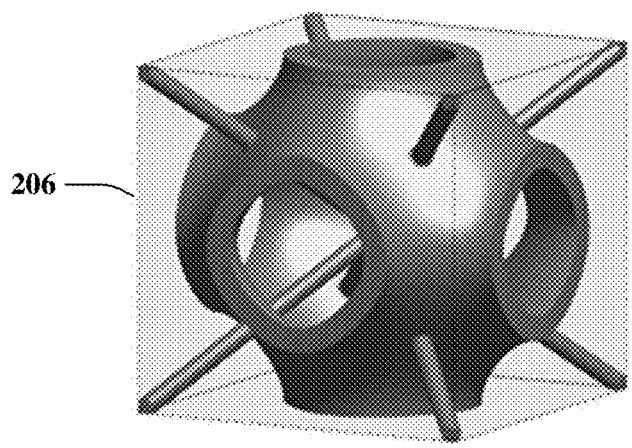

The level-set-based representation model serves various advantages for digitally building conformal cellular structures with variable and graded microstructures. Firstly, the level-set function is a convenient way of representing internal features of microstructures at high complexity and of any types (trusses, beams, shells, and general solids) via a unique scalar field. Secondly, basic Boolean operations, such as intersection, union and difference, between any two cells can be easily realized by a series of min/max operations. FIGS. 2A-2C depict two different unit base cells 202, 204 in FIGS. 2A and 2B, respectively, and a base cell of their combination 206 by the union operation in FIG. 2C.

A base microstructure of specific mechanical properties can also be obtained by performing structural optimizations. A number of such lattice materials have been studied to exhibit, for instance, negative Poisson's ratios and maximum bulk modulus.

In the various embodiments herein, the base cell or base microstructure is instrumental for generating spatially variable cellular structures. Various methods or techniques can be used to define or construct a geometric model of the base microstructure, such as feature-based, implicit function-based, or mesh-based models. A level-set function of the base microstructure can be constructed from a geometric model, such that an implicit model of the base cell is developed, satisfying a specified triply periodic condition. A direct method is to employ the signed distance function, by sampling absolute distances and determining the signs at the discrete sampling points.

The level-set-based representation of the base cell enables more advanced geometric operations by applying additional shaping functions, e.g., to manipulate the feature sizes. In addition, the level-set method has become a favorite for structural topology optimization, because of its unique merits in terms of flexible topological changes.

A cellular structure can be built by replacing specific regions of an object 302 with the base cell. FIGS. 3A-3C illustrate an example building process, which includes two steps, (a) generation of conformal mesh 304, and (b) cell domain transformation 306. In one example embodiment, the cell transformation process is characterized as an isoparametric transformation. As shown by the coordinate systems 400, two coordinate systems can be defined for different applicable domains: a Cartesian coordinate system and a natural coordinate system. The cellular structure to be constructed is positioned in the global Cartesian coordinate system, $x=\{x, y, z\}$. The entire structural domain of the structure $x \in D$ is underlined with a set of mesh of arbitrarily-shaped hexahedrons in 3-D (or quadrilaterals in 2-D), whose nodes are positioned at $x_i=\{x_i, y_i, z_i\}$, $i=1, \ldots, 8$, for instance, in the case of tri-linear interpolation.

Figure 4:
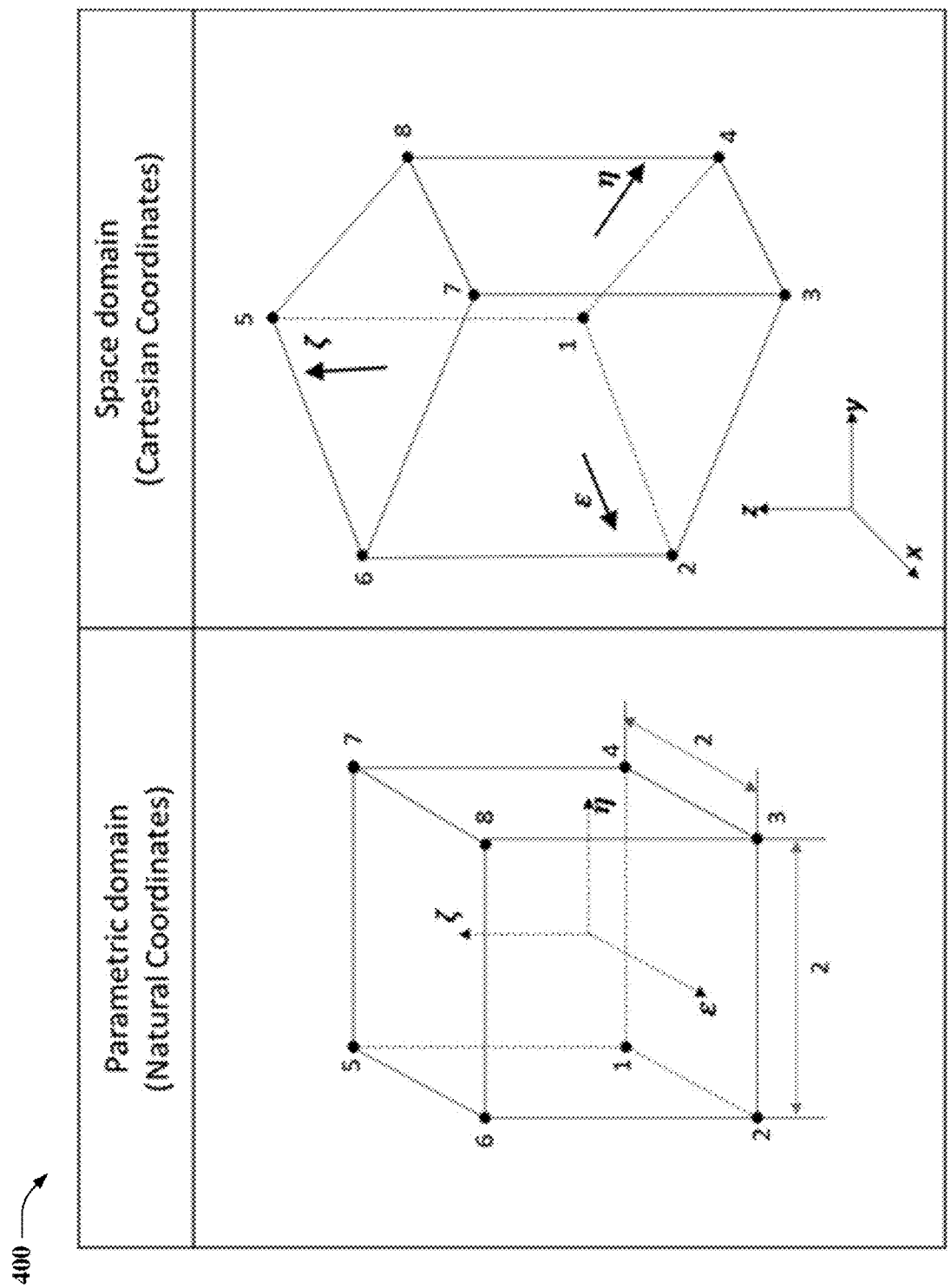
FIG. 4 represents the isoparametric transformation of a unit cube in the natural coordinate system (left) to the Cartesian coordinate system (right), in accordance with an example embodiment.

For instance, the base cell can be defined in the natural coordinate system, $\{\varepsilon, \eta, \zeta\} \in [-1, 1]$, within a standard cube of side length 2, as shown in FIG. 4. In employing isoparametric transformations, the base cell is to be transformed and mapped into each element of the hexahedron (or quadrilateral) mesh and assembled into the global coordinate system to form the cellular structure. The mapping relation is expressed as, for the tri-linear interpolation instance:

$$\begin{pmatrix} x \\ y \\ z \end{pmatrix} = \sum_{i=1}^{8} N_i(\varepsilon, \eta, \zeta) \begin{pmatrix} x_i \\ y_i \\ z_i \end{pmatrix} \quad (4)$$

where, x, y and z denote the position coordinates of the transformed base cell in the Cartesian coordinate system, and $N_i$ denotes the shape function for the node i of the hexahedron mesh. These shape functions can be obtained by the Lagrange interpolation, for example, for tri-linear interpolation:

$$N_i(\varepsilon,\eta,\zeta)=\tfrac{1}{8}(1+\varepsilon_i\varepsilon)(1+\eta_i\eta)(1+\zeta_i\zeta), i=1,\ldots,8 \quad (5)$$

where $\varepsilon_i$, $\eta_i$ and $\zeta_i$ denote node coordinates of the standard cube in the natural coordinate system, and $\varepsilon$, $\eta$ and denote $\zeta$ the inner coordinates of the standard cube in the natural coordinate system. FIG. 4 illustrates the standard isoparametric transformation on a hexahedron mesh.

FIG. 3A represents a perspective view of a cylindrical solid 302 and a perspective view of a mesh discretization form of the cylindrical solid 304. In FIG. 3C, the unit base cell depicted in FIG. 1 is transformed and mapped into each of the hexahedron mesh elements of the cylindrical mesh solid in FIG. 3B, according to Eq. (4). This example represents a construction process of designing a cellular structure with geometrically connected microstructures embedded in the global structure of a regular mesh discretization.

The level-set function values at the grid points, as well as the grid connection relationship are retained during the transformation process. Hence, the topological configuration of the original base cell would be preserved on the transformed mesh domain. Moreover, the relative density of the transformed cell will also remain unchanged. However, the orientations and sizes of the features will be varied. Such a strategy is equivalent to first extracting the triangulated iso-surface mesh in the regular cell domain, and then to transforming the mesh to the global element.

The isoparametric transformation illustrated in FIGS. 3A-3C shows an example process of modeling and designing three-dimensional cellular structures. In the example, the base cell is triply periodic and is periodically repeated within the cell grid. Thus, the generated cellular structures retain full geometric connectivity across the faces of the adjacent microstructural cells, and remain internally connected. The resulting cellular structure has spatially transformed microstructural cells from the identical base cell without any gradient or variation in the cell itself.

It is noted that one may attempt to vary or achieve graded mechanical properties among these distributed cells of the above constructed cellular structure by taking different members from the family of the base cells, created with different level-set values, rather than the zero level-set, on the "mother" base cell level-set function $\phi(x)$. In other words, for a mesh element i of the volumetric mesh, its base cell could be taken at $\phi(x)=h_i$, where $h_i$ is a signed constant and indicates an offset in the level-set of the base cell; namely, the base cell used for the element is described by:

$$\phi(x)-h_i=0 \quad (6)$$

Figure 5A:
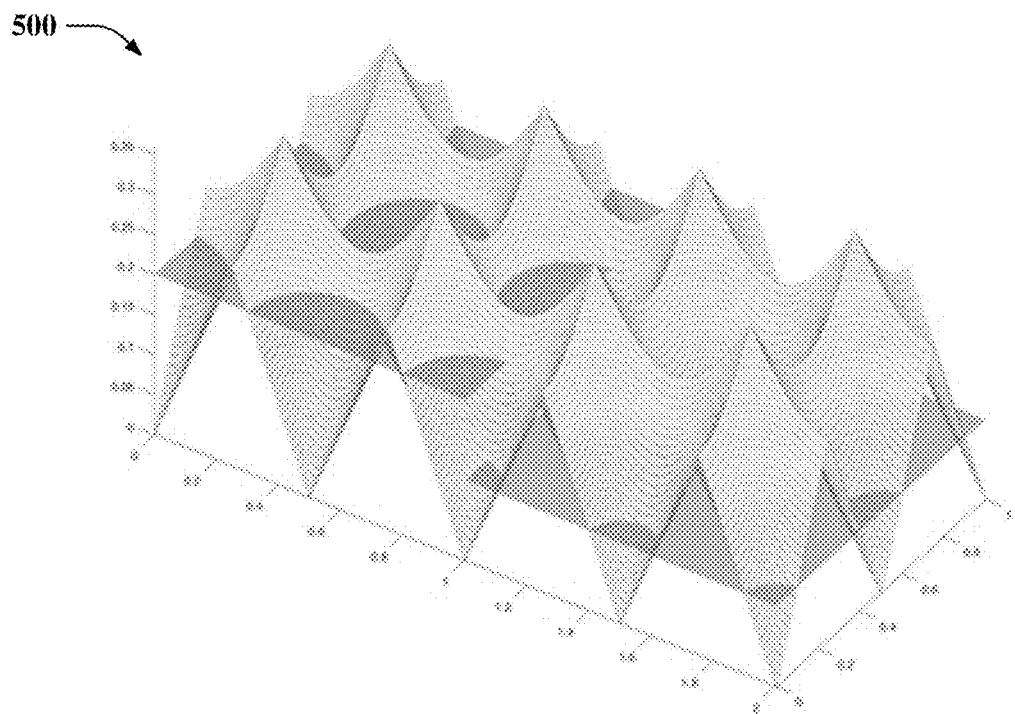
FIGS. 5A-5B illustrate the process of connecting two cells that have the same level set function of the base cell, in accordance with an example embodiment, with FIG. 5A showing two connecting cells that have discontinuous geometric connection at their connection face and FIG. 5B showing two connecting cells that have geometric connection continuity at their connection face.

However, the assembled cellular structure may exhibit different member sizes at the cell faces due to different offset heights in Eq. (6), e.g., as illustrated in graphs 500 and 502 of FIGS. 5A and 5B, respectively. Different offset heights can lead to discontinuous geometries on the common faces between two neighboring microstructures in the cellular structure. As mentioned, any mismatched connection could cause undesirable effects on the mechanical properties and structural integrity of the cellular structure, such as high stress concentrations and severely reduced load bearing capability of the cellular structure. In addition, mismatched connections could yield overhang regions, making fabrication difficult or impossible, e.g., for additive manufacturing processes.

Figure 6:
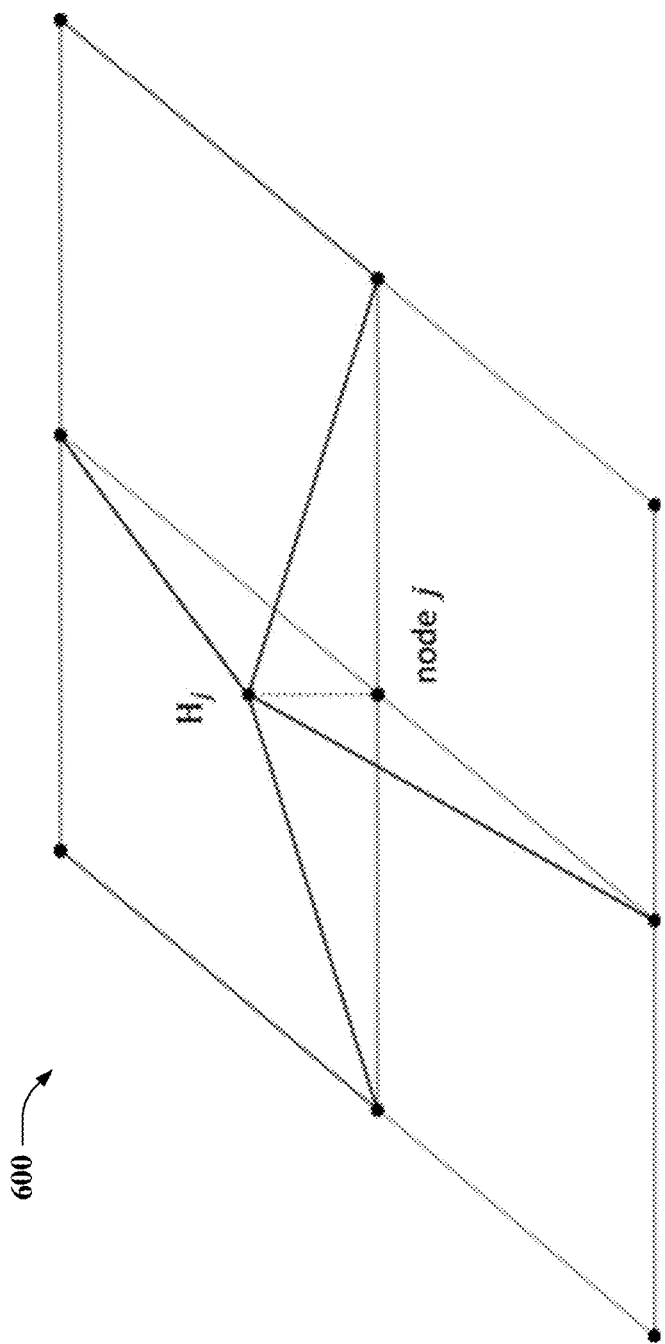
FIG. 6 illustrates a nodal cutting height at a nodal position, in accordance with an example embodiment.
Figure 7A:
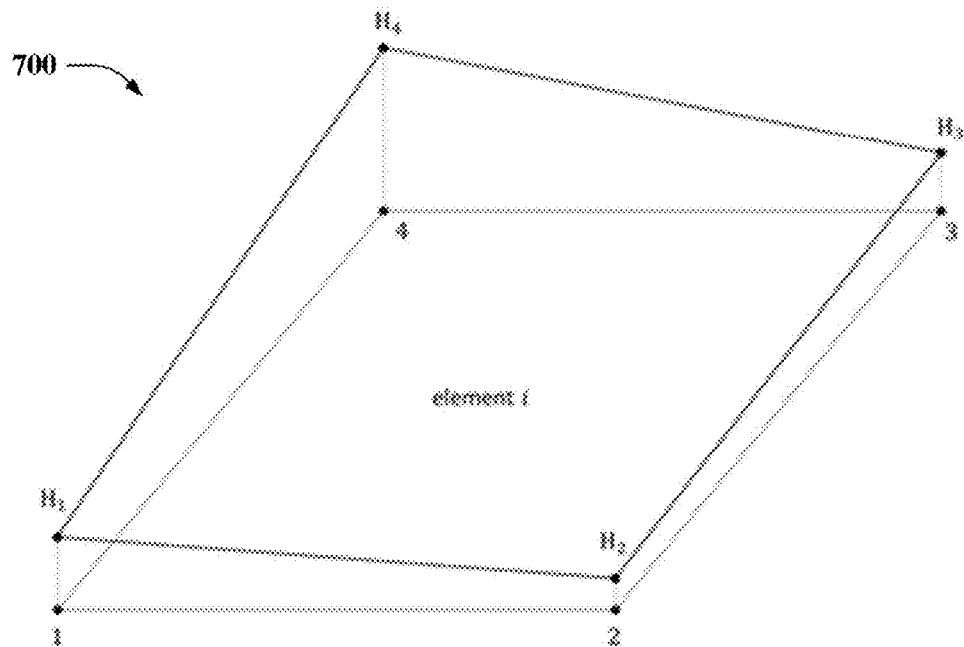
FIG. 7A depicts a cutting function for a 2D element with a bilinear interpolation scheme, in accordance with an example embodiment.
Figure 7B:
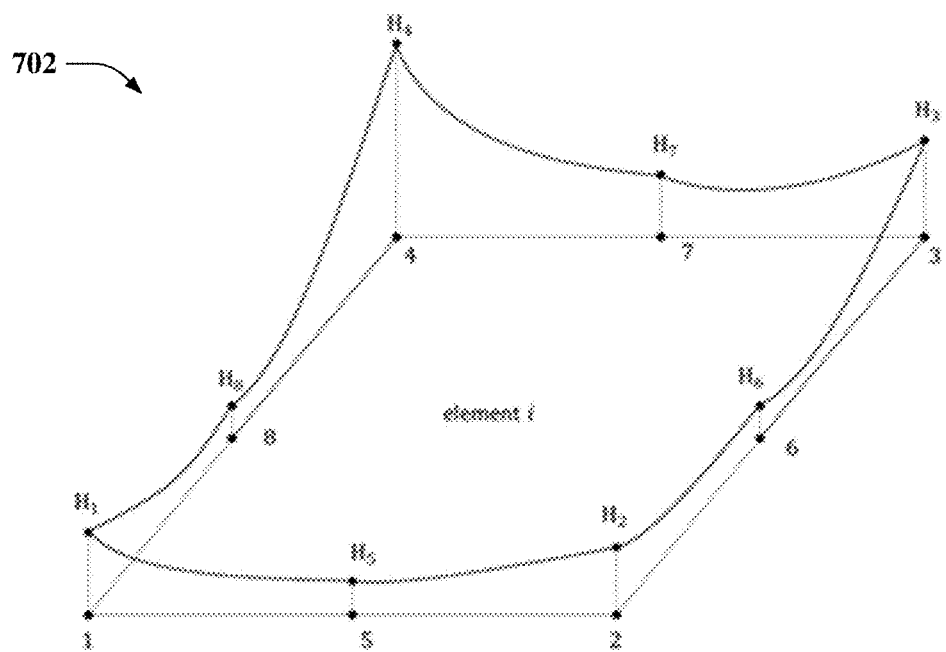
FIG. 7B depicts a higher-order cutting function for a 2D element with a second-order interpolation scheme, in accordance with an example embodiment.
Figures 8A, 8C:
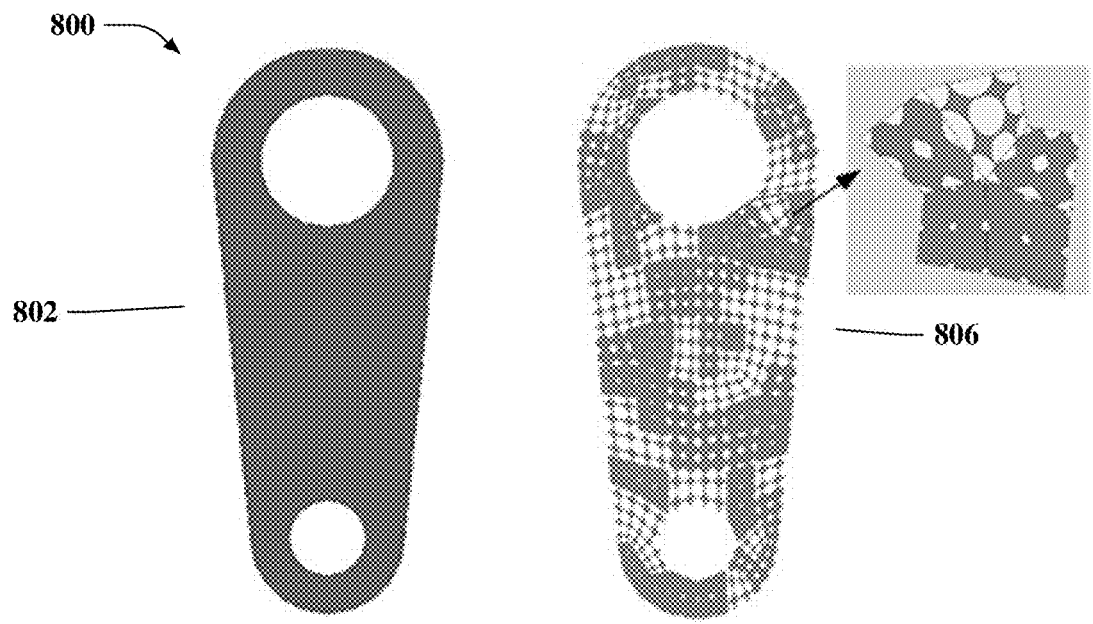
FIGS. 8A-8D show an example of a conformal cellular structure in 2D, in accordance with an example embodiment, with FIG. 8A representing a 2D bracket, FIG. 8B representing a discretization of the 2D bracket using conforming quadrilateral mesh, FIG. 8C showing the bracket with microstructural cells using individual and different offset values, resulting discontinuous geometric connections at their common faces, and FIG. 8D showing the bracket with conformal microstructural cells in accordance with global cutting method, resulting continuous geometric connections at their common faces.
Figures 8B, 8D:
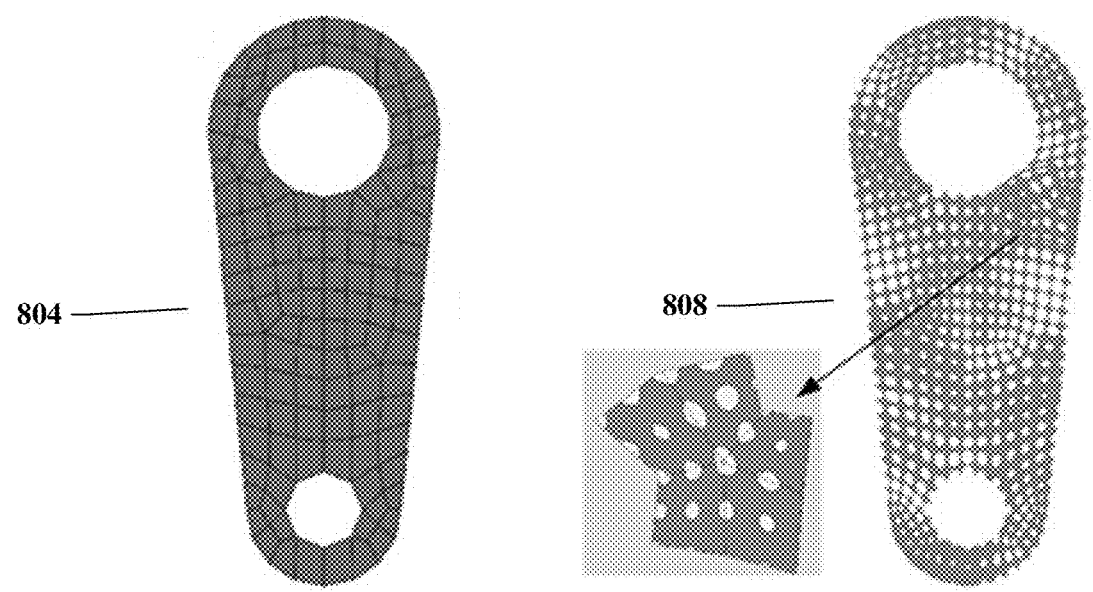

Here, a global (and regional) "cutting" function is defined to achieve variable and graded microstructures with complete geometric connectivity on the common face between neighboring microstructural cells. At each given grid point j (or nodal point) in the global coordinate system 600, a cutting height $H_j$ is defined, as shown in FIG. 6. For each element i of the volume mesh, the collection of the cutting heights at all its nodes $H_{i,j}$ defines the nodal vector $H_i$ of the element. For example, for a hexahedron element with trilinear interpolation, $H_i = \{H_1, H_2, \ldots, H_8\}_i$. Using the conventional concept of shape functions, the cutting function $h_i(x)$ within the element i is readily defined as $h_i(x) = \Sigma_k N_k(x) H_{i,k}$, in terms of a set of trilinear (or bi-linear) or higher order interpolation functions, such as Lagrange polynomials. FIG. 7A depicts a cutting function 700 with bilinear interpolation among the four cutting heights $H_j$ at the four nodal positions in two dimensions, while FIG. 7B depicts a non-linear cutting function 702 for case of the second order interpolation among the eight cutting heights at the eight nodal positions $H_j$ for the two-dimensional case as well.

By augmenting a cutting function to the base cell level set function $\phi(x)$, each microstructural cell of the constructed cellular structure is implicitly represented as follows:

$$f_i(x) = \phi(x) - h_i(x) = 0, x \in D_i. \quad (7)$$

More specifically, for a cell of trilinear interpolation, the level-set function of the cell is given as:

$$f_i(x) = \phi(x) - \Sigma_{k=1}^{8} N_k(x) H_{i,k} = 0, x \in D_i. \quad (8)$$

In all events, the cellular structure resulting from this construction process is represented with:

$$f_i(x) \begin{cases} > 0 & \text{if } x \in \Omega \\ = 0 & \text{if } x \in \Gamma \\ < 0 & \text{if } x \in D_i / (\Omega \cup \Gamma) \end{cases} \quad (9)$$

where $\Gamma$ and $\Omega \subseteq D_i$ respectively depict the structural boundary and the solid region of the complete cellular structure, comprising of all hexahedron mesh elements with corresponding microstructural cells $D_i$, each of which is defined by Eq. (9) while its base cell is transformed according to Eq. (4).

Figure 5B:
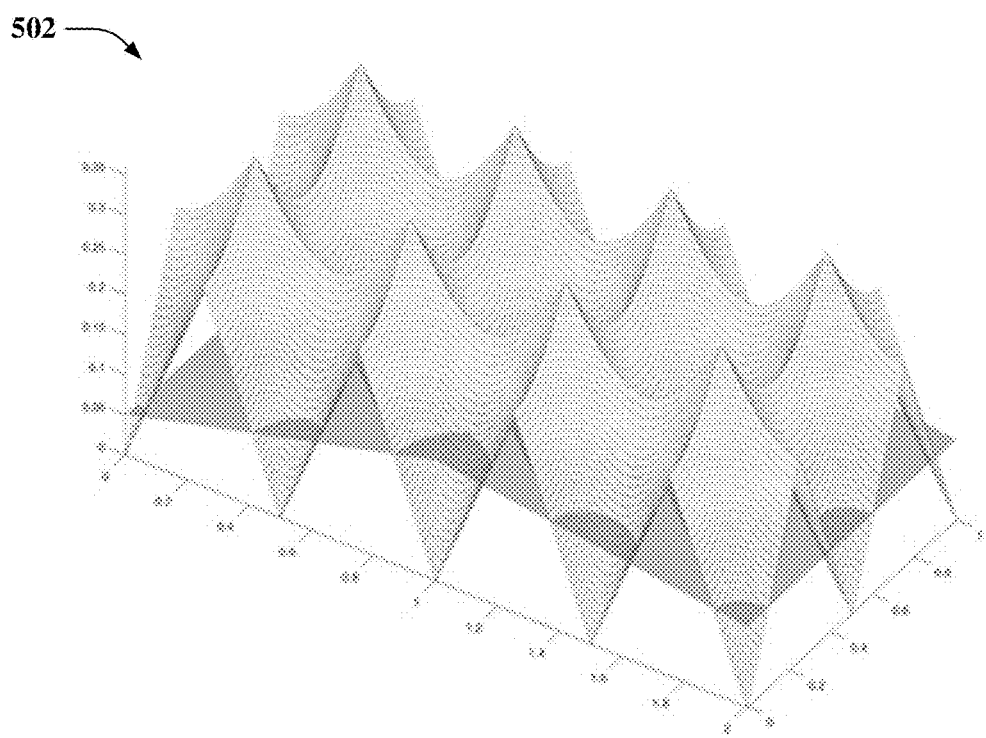

With this global cutting technique, it is evident that the global geometry of the resulting cellular structure would preserve at least $C^0$ continuity at the faces of the neighboring cell elements, as illustrated in FIG. 5B. The global cutting technique is expressed to exert leveling control in a global (or regional) fashion. The use of the conventional shape functions of an interpolation scheme in the first order (linear) or the higher order (non-linear) is known to be efficient. Therefore, the cutting scheme can be implemented in an efficient manner.

In FIGS. 8A-8D, a 2-D example 802 is presented to illustrate the effectiveness of the height leveling technique. In addition to the isoparametric transformation, the global cutting process yields variations in geometric features of the cells, even resulting in topological changes as well, while retaining full geometric connectivity, thus offering variable and graded mechanical properties across the cells in the resulting cellular structure.

The cutting heights $H_j$ at the nodal points $x_j$ represent a set of design parameters applicable to design elements 804. It is evident from representations 806, 808 that, as a result of the global cutting, a cell element could become a complete void region, or on the other hand, a complete solid region. Thus, the global cutting technique offers a potential capability for topology optimization of a cellular structure, if the problem is properly defined and framed for that purpose. These effects could be easily restricted, on the other hand, if a set of proper lower limits and/or upper limits on the cutting heights are imposed in the design or optimization. In fact, the level-set method has become a favorite for structural topology optimization, because of its unique merits in terms of flexible topological changes.

Figure 9A:
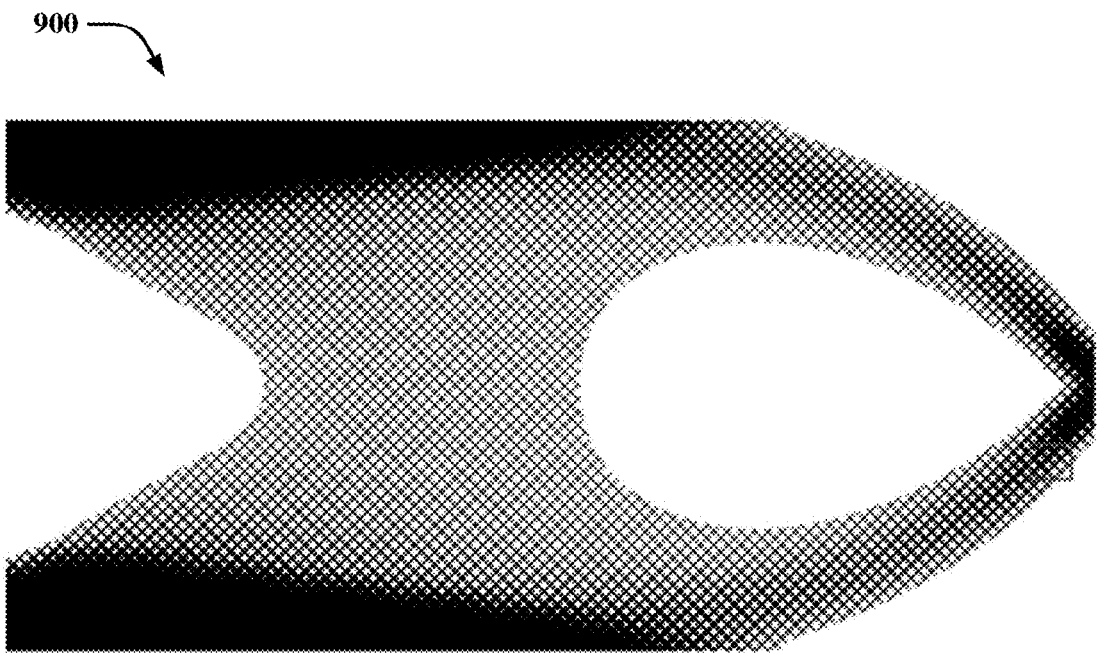
FIGS. 9A-9B illustrates a conformal cellular cantilever beam in 2D, in accordance with an example embodiment, with FIG. 9A illustrating a cellular structure in two dimensions that exhibits variable and graded distribution with full geometric connectivity at the cell faces between all neighboring cells and FIG. 9B showing the values of the resulting cut heights at the four nodes of an element.
Figure 9B:
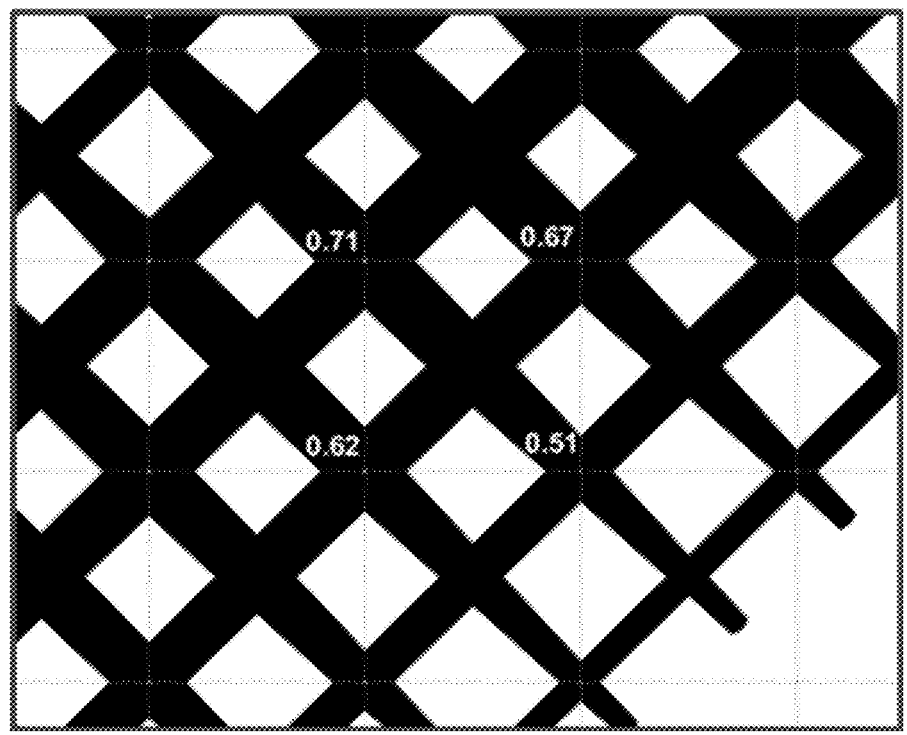

FIGS. 9A and 9B illustrate a cellular structure in two dimensions constructed with the disclosed embodiments. According to a user-defined distribution in specified material density and mechanical property over the 2-D rectangular design domain, as shown in FIG. 9A, the cellular structure 900 exhibits variable and graded distributions accordingly with full geometric connectivity at the cell faces between all neighboring cells. In a close up 902 of FIG. 9B, example values of the resulting cut heights at the four nodes of an element in the center of FIG. 9A are shown.

Figure 10A:
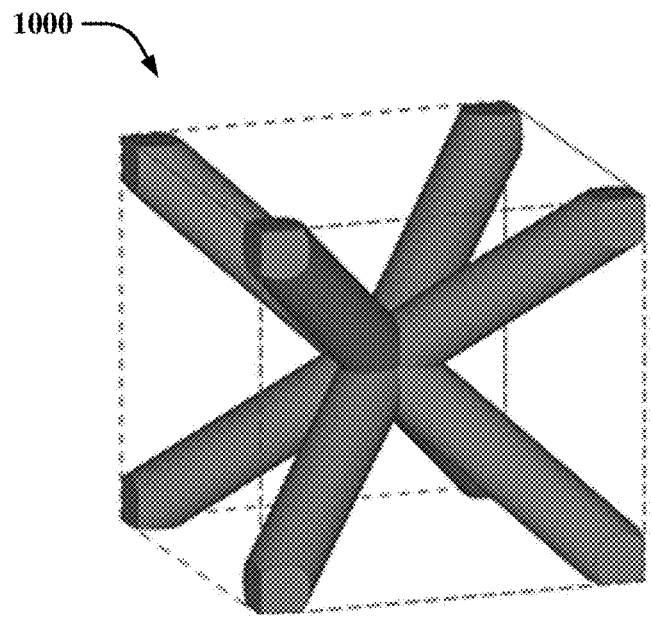
FIG. 10 depicts 3D base cells, in accordance with an example embodiment.
Figure 10B:
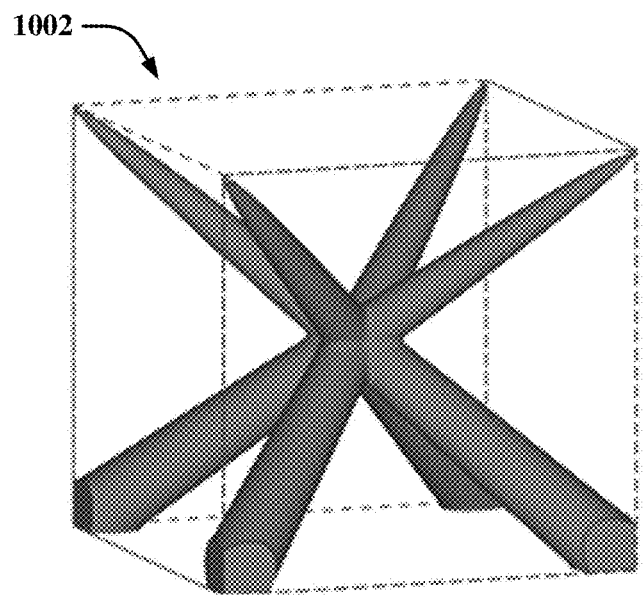

FIGS. 10A-10B depict 3-D base cells 1000, 1002, often called lattice cells, in accordance with disclosed embodiments. The base cell 1000 is constructed with an identical value in the cut heights $H_j$ of its eight nodes, while its variation 1002 uses different values of the nodal cut heights.

Figure 11A:
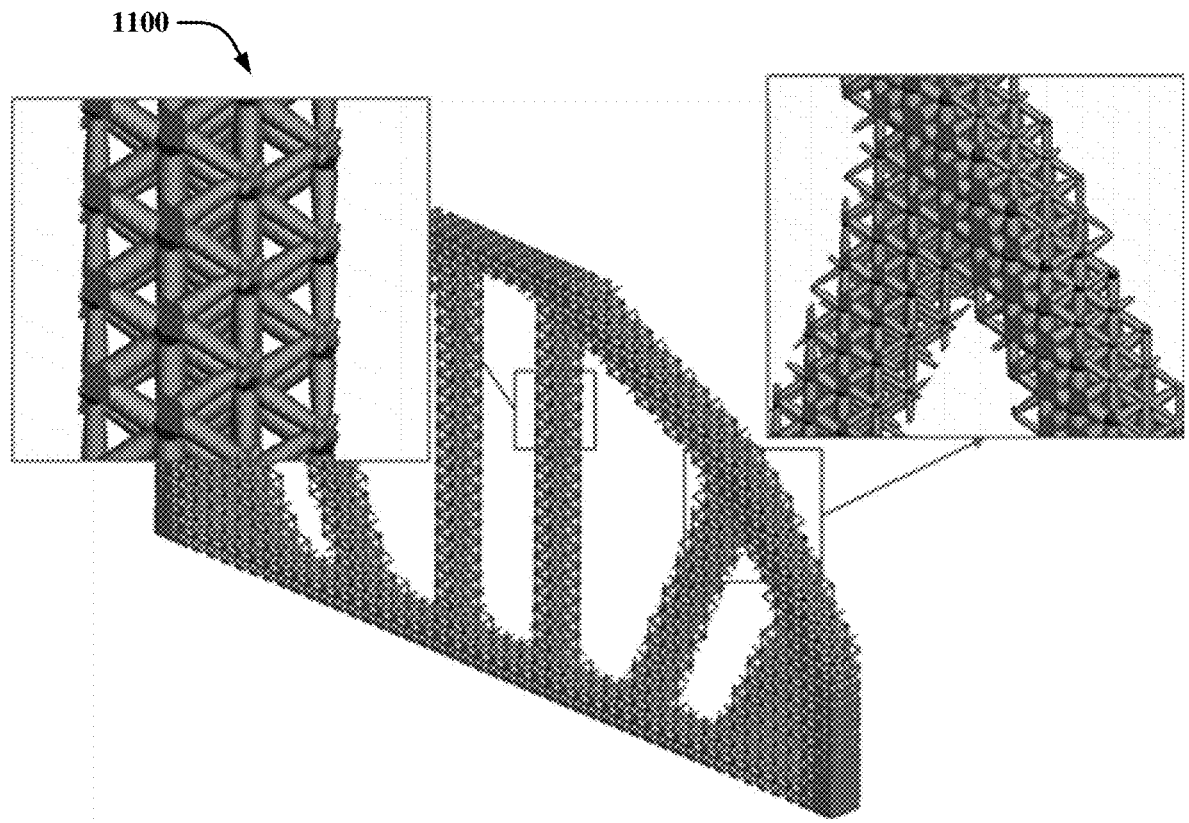
FIGS. 11A-11B illustrate two cellular structures in three dimensions based on the base cell shown in FIG. 10, in accordance with an example embodiment, with FIG. 11A illustrating a conformal cellular structure representing a bridge and FIG. 11B representing a load carrying cellular structure with a concentrated point load applied downwards in the center of the top face.
Figure 11B:
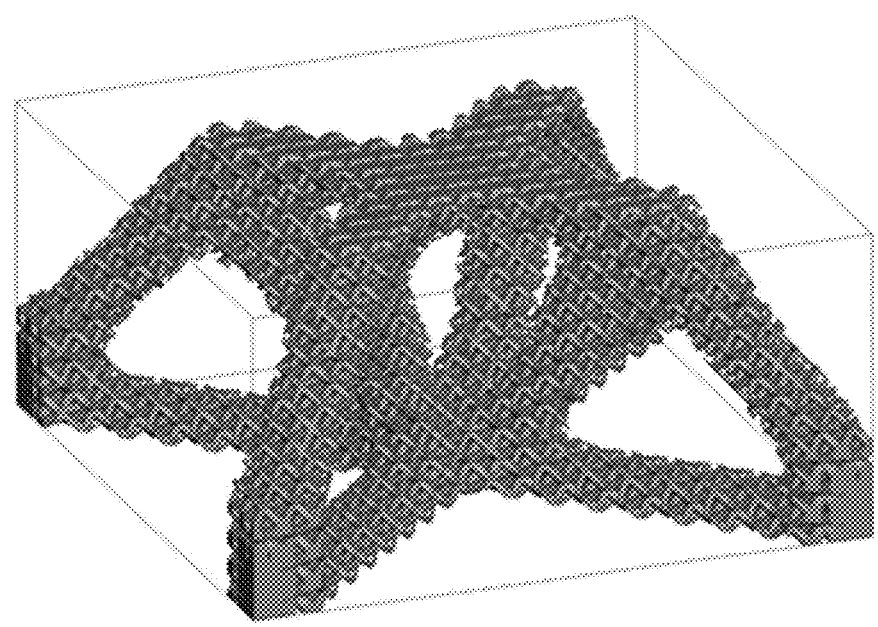

FIGS. 11A and 11B illustrate two cellular structures 1100, 1102 in three dimensions constructed in accordance with the disclosed embodiments. In the example, the base cell depicted in FIG. 10 is employed in these two conformal cellular structures 1100, 1102. According to a user-defined distribution in specified material density and mechanical property over the 3-D design domain of a rectangular box, both the cellular structures 1100, 1102 exhibit variable and graded distributions accordingly with full geometric connectivity at the cell faces between all neighboring cells. In FIG. 11A for a model 1100 of a load-carrying bridge, the zoom-in views highlight the geometric features and their $C^0$ continuity across cells of the cellular bridge. FIG. 11B represents a load carrying structure 1102 with a concentrated point load applied downwards in the center of the top face.

Figure 12:
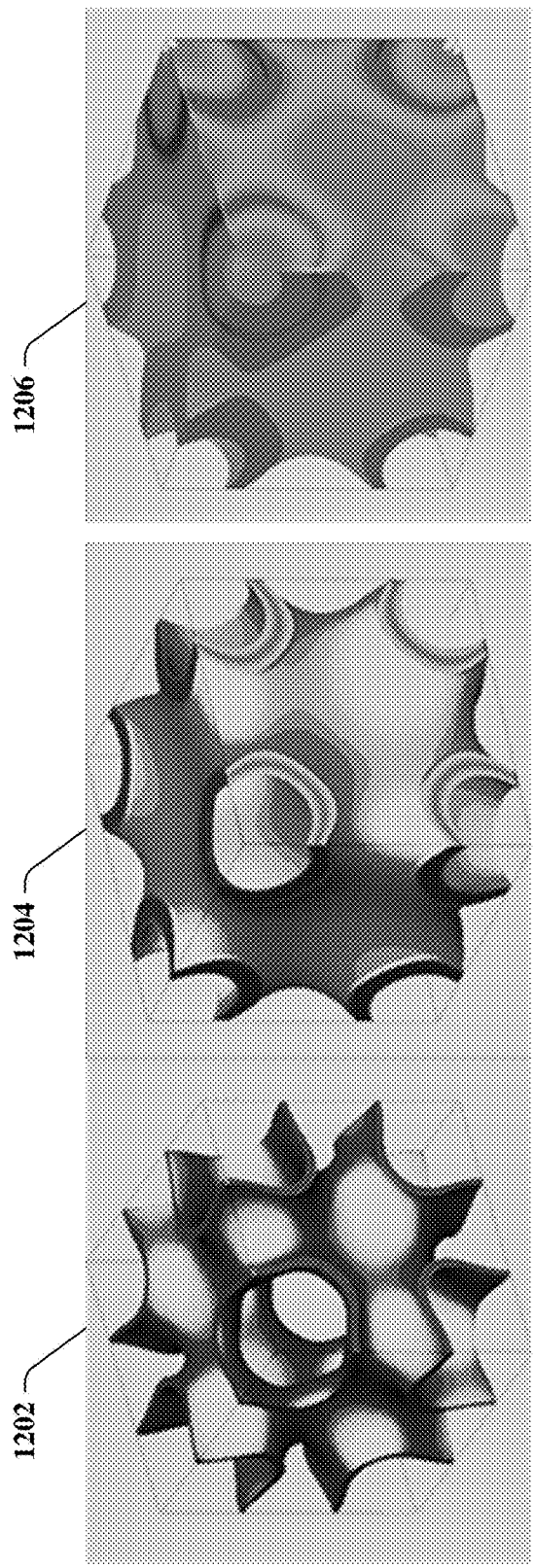
FIG. 12 depicts 3D base cells of the I-WP type of triply periodic minimal surface representation, in accordance with an example embodiment.

FIG. 12 depicts 3D base cells of the I-WP type of triply periodic minimal surface representation (e.g., Eq. 3) in accordance with disclosed embodiments. Two base cells 1202, 1204 are constructed with an identical value in the cut heights of its eight nodes, while a variation 1206 is shown using different values of the nodal cut heights.

Figure 13A:
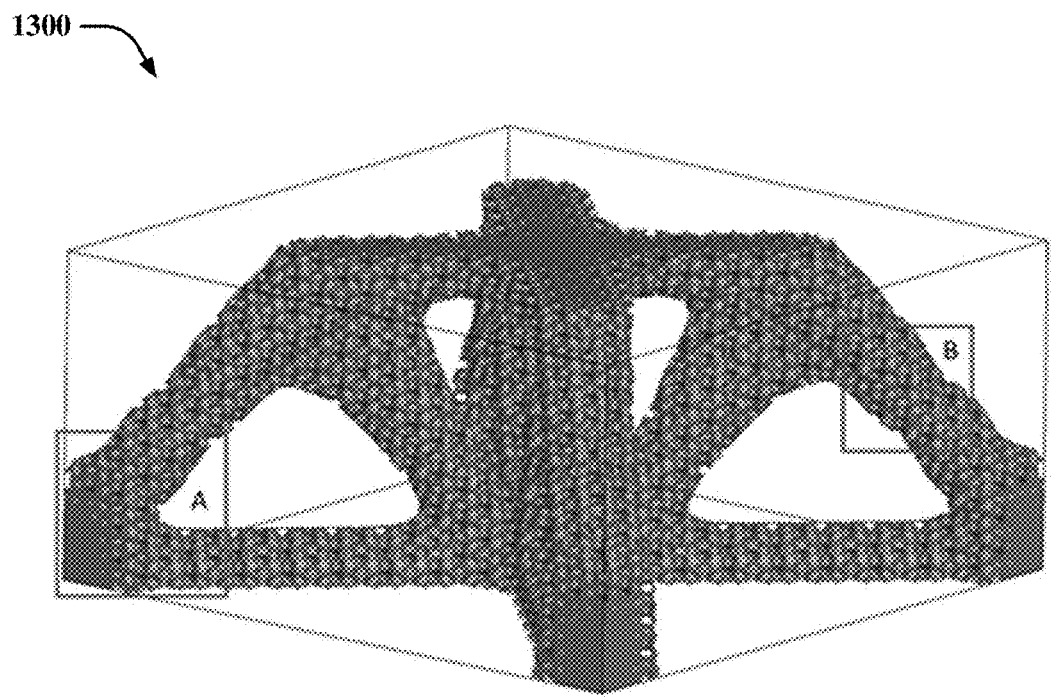
FIGS. 13A-13B illustrate a conformal cellular structure in three dimensions based on the base cell shown in FIG. 12, in accordance with an example embodiment, with FIG. 13A illustrating a conformal cellular structure with the I-WP type base cell and FIG. 13B showing two zoom-in views.
Figure 13B:
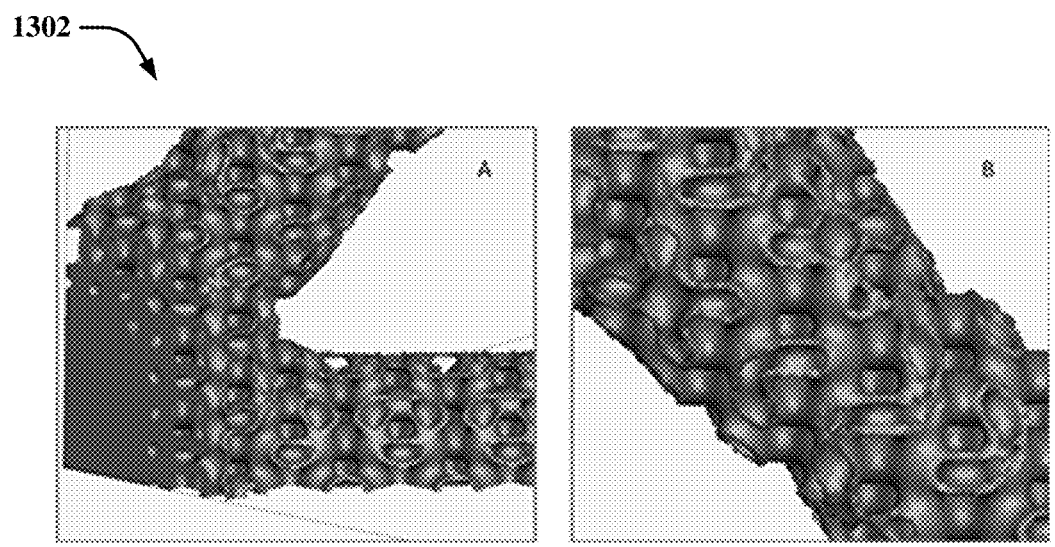

FIGS. 13A and 13B illustrate a cellular structure in three dimensions 1300 constructed in accordance with the disclosed embodiments. The base cell of the I-WP type depicted in FIG. 12 is employed in the conformal cellular structure, whose basic configuration is similar to that of FIG. 11B in a load-carrying application. According to a user-defined distribution in specified material density and mechanical property over the 3-D design domain of a rectangular box, the conformal cellular structure exhibits variable and graded distributions accordingly with full geometric connectivity at the cell faces between all neighboring cells. In FIG. 13B, the zoom-in views 1302 highlight the geometric features and their $C^1$ continuity across cells in their geometric connections.

In addition, the level-set-based representation enables more advanced geometric operations by applying additional shaping functions, e.g., to manipulate the feature sizes. A cell shaping function g(x) can be introduced on an individual cell basis to serve a purpose of varying geometric shape of a base cell. In order to guarantee the connectivity at the interface between adjacent cells in the constructed cellular structure, the cell shaping function is applied to vanish at the cell faces (or edges). For the purpose, a sine-type shaping function is expressed as:

$$g(x)=c\,\sin(\pi x)\sin(\pi y)\sin(\pi z), x=\{x,y,z\}\in D \quad (10)$$

where c denotes a coefficient term. Higher-order terms may also be introduced, leading to a shaping function, for example, as:

$$g(x) = \sum_{m=1}^{2}\sum_{n=1}^{2}\sum_{p=1}^{2} c_{m,n,p}\sin(m\pi x)\sin(n\pi y)\sin(p\pi z), \quad (11)$$

$$x = \{x, y, z\}\in D$$

with coefficients $c_{m,n,p}$. In an augmentation of the level-set function $\phi(x)$ of the base cell i by adding a cell shaping function $g_i(x)$, the implicit representation of the modified (or shaped) individual cell is defined by the new implicit function $\phi_i(x)$:

$$\phi_i(x)=\phi(x)-g_i(x)-h_i=0, x\in D_i \quad (12)$$

Similarly to Eq. (6), the geometry of the shaped cell is implicitly given at a cut-off level $h_i$ of the shaped level-set function.

Figure 14A:
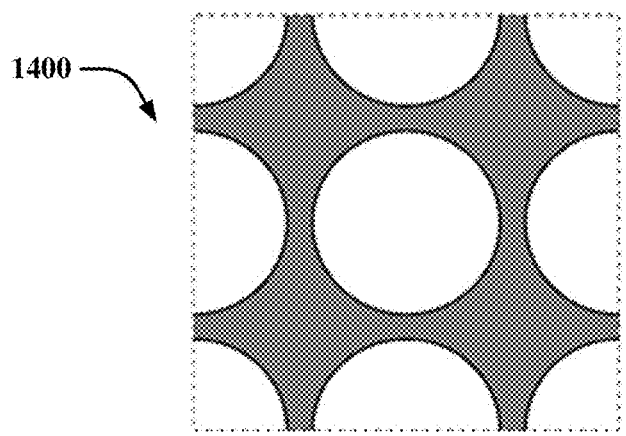
FIGS. 14A-14C shows constant offsets of a base cell level set, in accordance with an example embodiment, with FIG. 14A representing a 2D-base unit cell, FIG. 14B showing the plot of the signed distance function of the base unit cell in FIG. 14A, including offset planes at various heights, and FIG. 14C showing three base unit cells corresponding to the offsets in FIG. 14B, together with contours of the base unit cell in FIG. 14A in dashed lines.
Figure 14B:
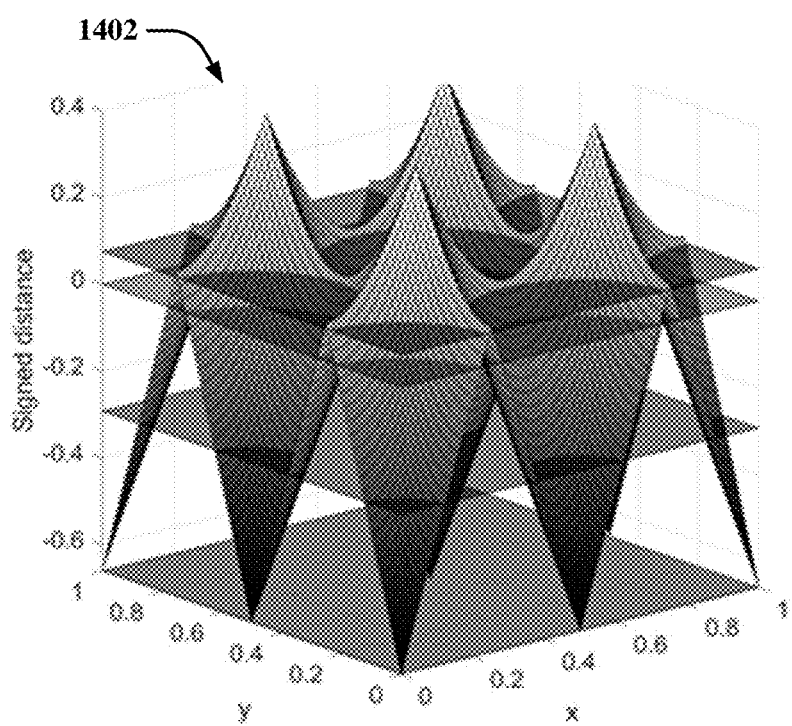
Figure 14C:
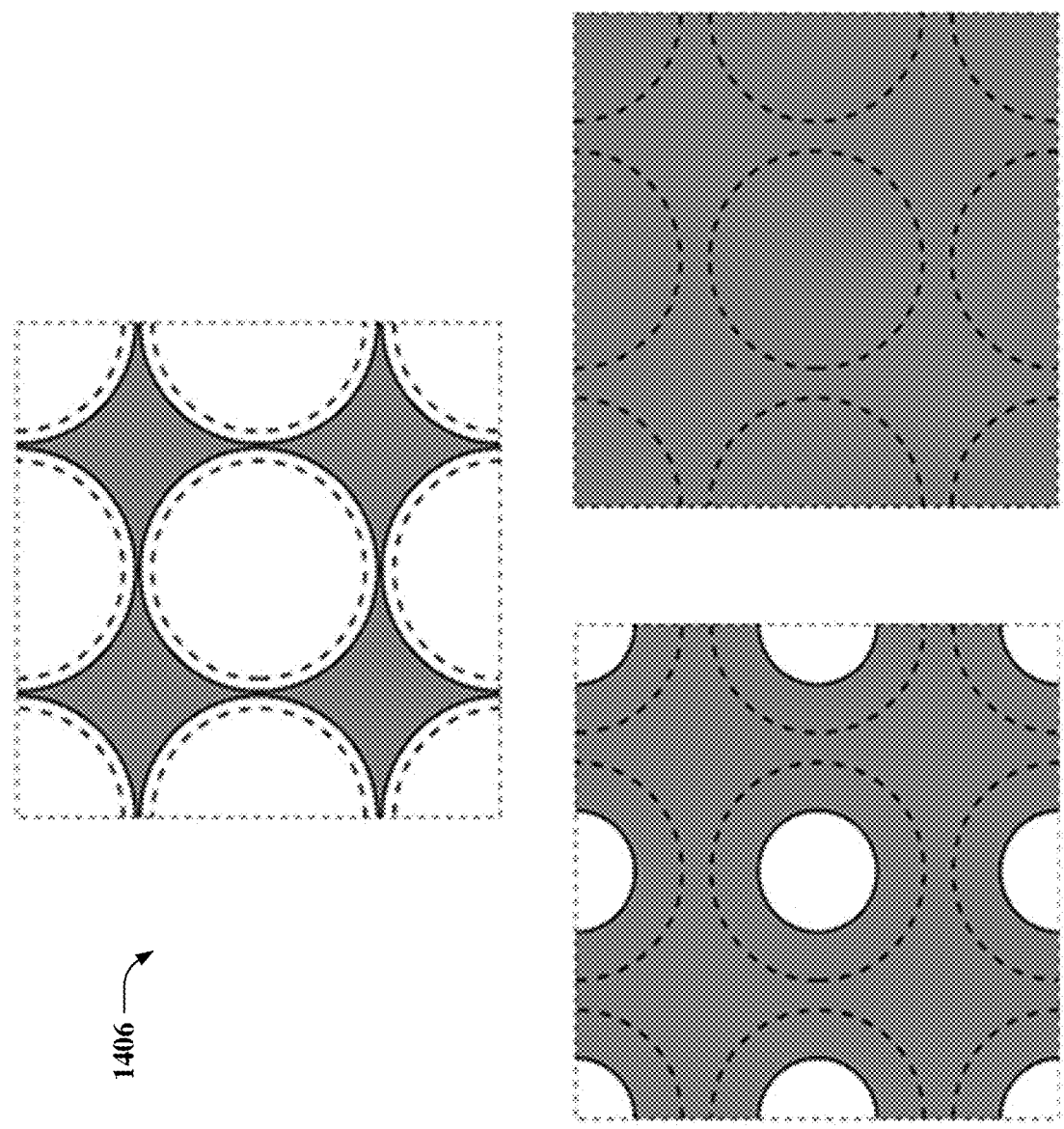

FIG. 14A shows a 2-D base unit cell 1400 and FIG. 14B shows the signed distance field 1402 generated from the 2-D base unit cell 1400 with two different offset constants $h_i$. At these offset values $h_i$, three different base cells 1406 are generated, as shown in FIG. 14C, with contours of the original base cell in FIG. 14A in dashed lines.

Effects of the geometric shaping process are illustrated in FIGS. 15A-15D, with the shaping function of Eq. (10) or/and Eq. (11) applied to the original base cell 1400 of FIG. 14A. In comparison, the geometric shaping process allows for more general shape variations of the base cells, introducing sharps edges to smooth shapes, accentuating the curvature of a shape, and other variations, some of which can be observed in the example distance fields 1500, 1502, 1504, 1506 with resulting different base cells 1510, 1512, 1514, 1516 in FIGS. 15A, 15B, 15C and 15D, respectively.

Figure 15A:
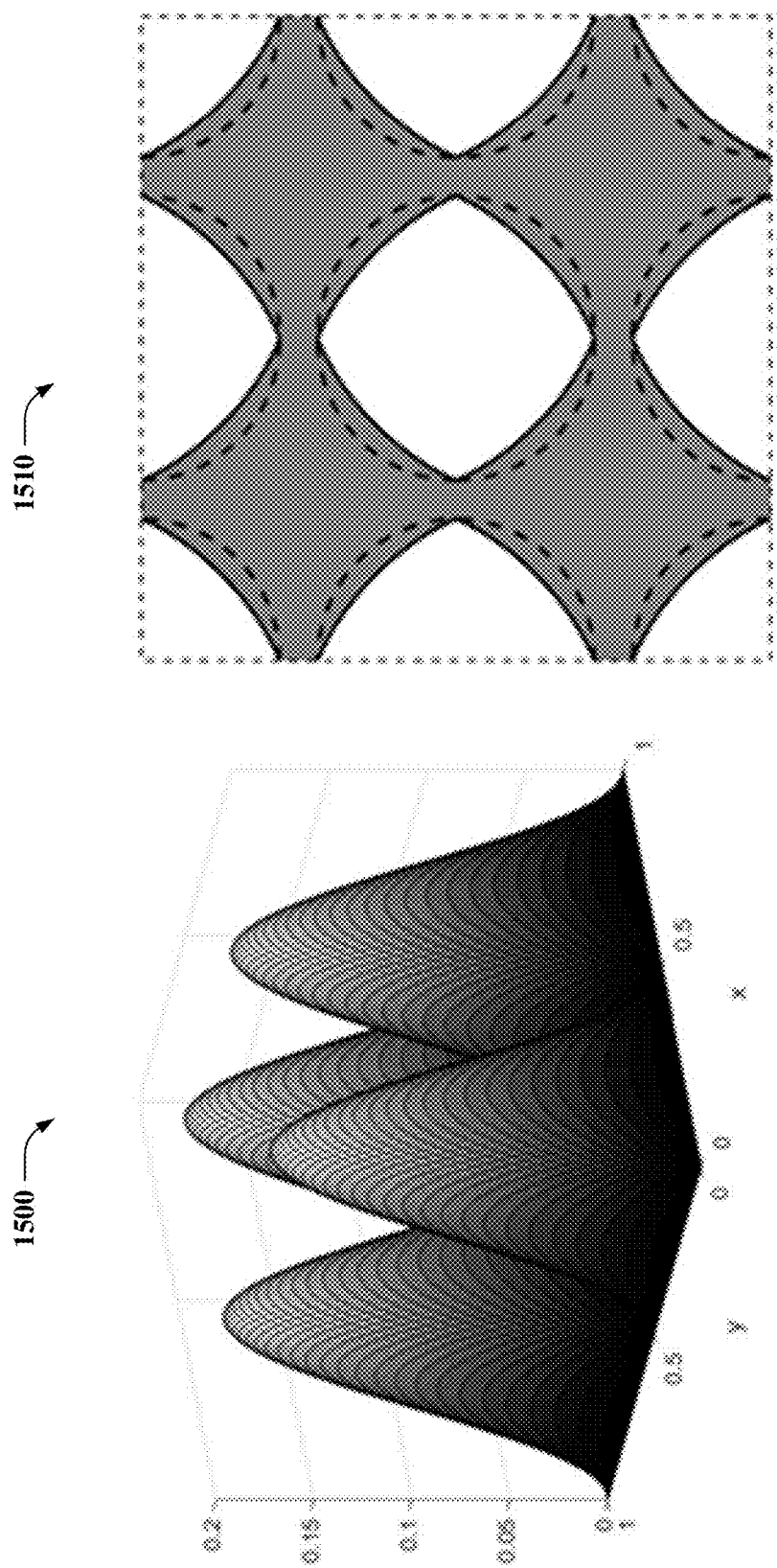
FIGS. 15A-15D show various effects of geometric shaping, in accordance with an example embodiment, with FIG. 15A showing one geometric shaping function (left) and the resulting base cell (right), with the contours of the original base cell in dashed lines, FIG. 15B showing a second geometric shaping function (left) and the resulting base cell (right), with the contours of the original base cell in dashed lines, FIG. 15C showing a third geometric shaping function (left) and the resulting base cell (right), with the contours of the original base cell in dashed lines and FIG. 15D showing fourth geometric shaping function (left) and the resulting base cell (right), with the contours of the original base cell in dashed lines.
Figure 15B:
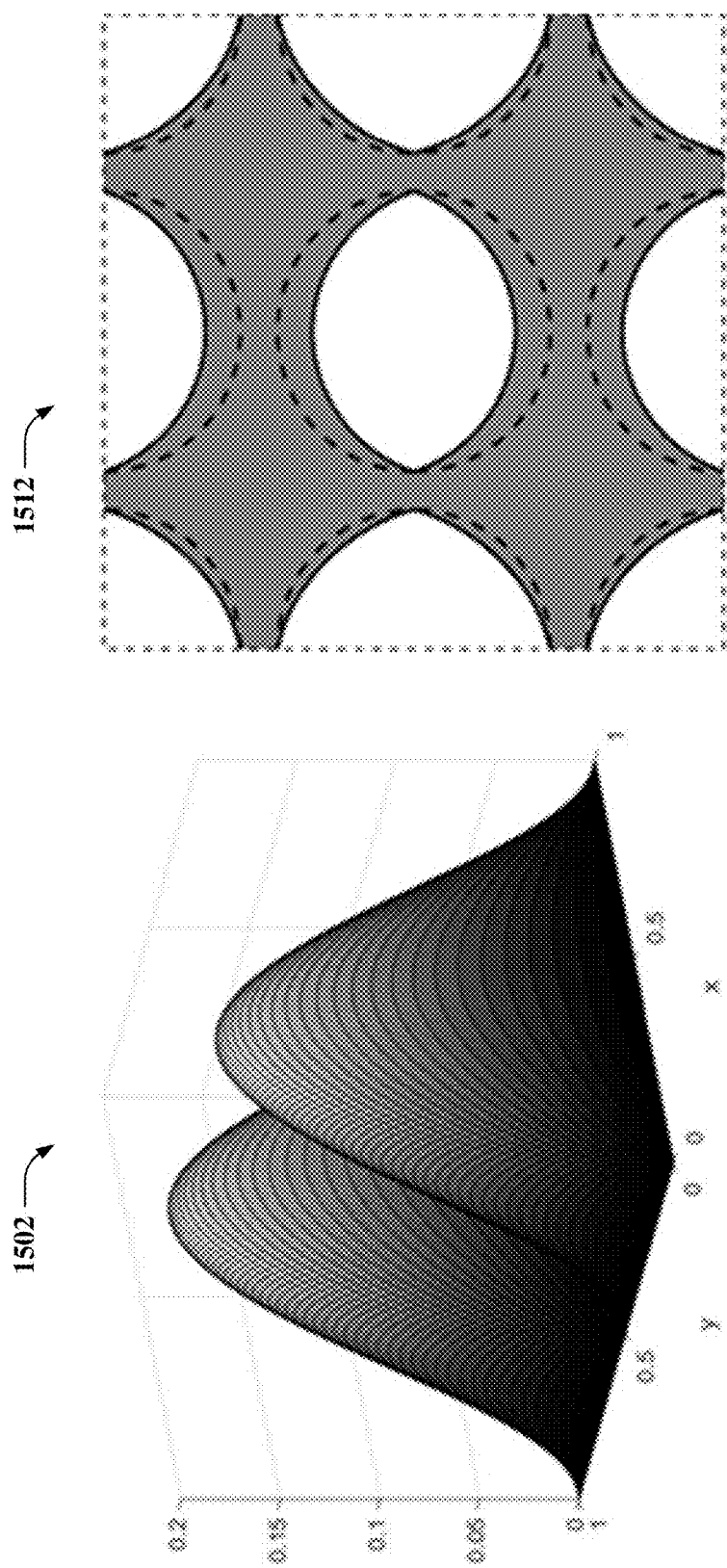
Figure 15C:
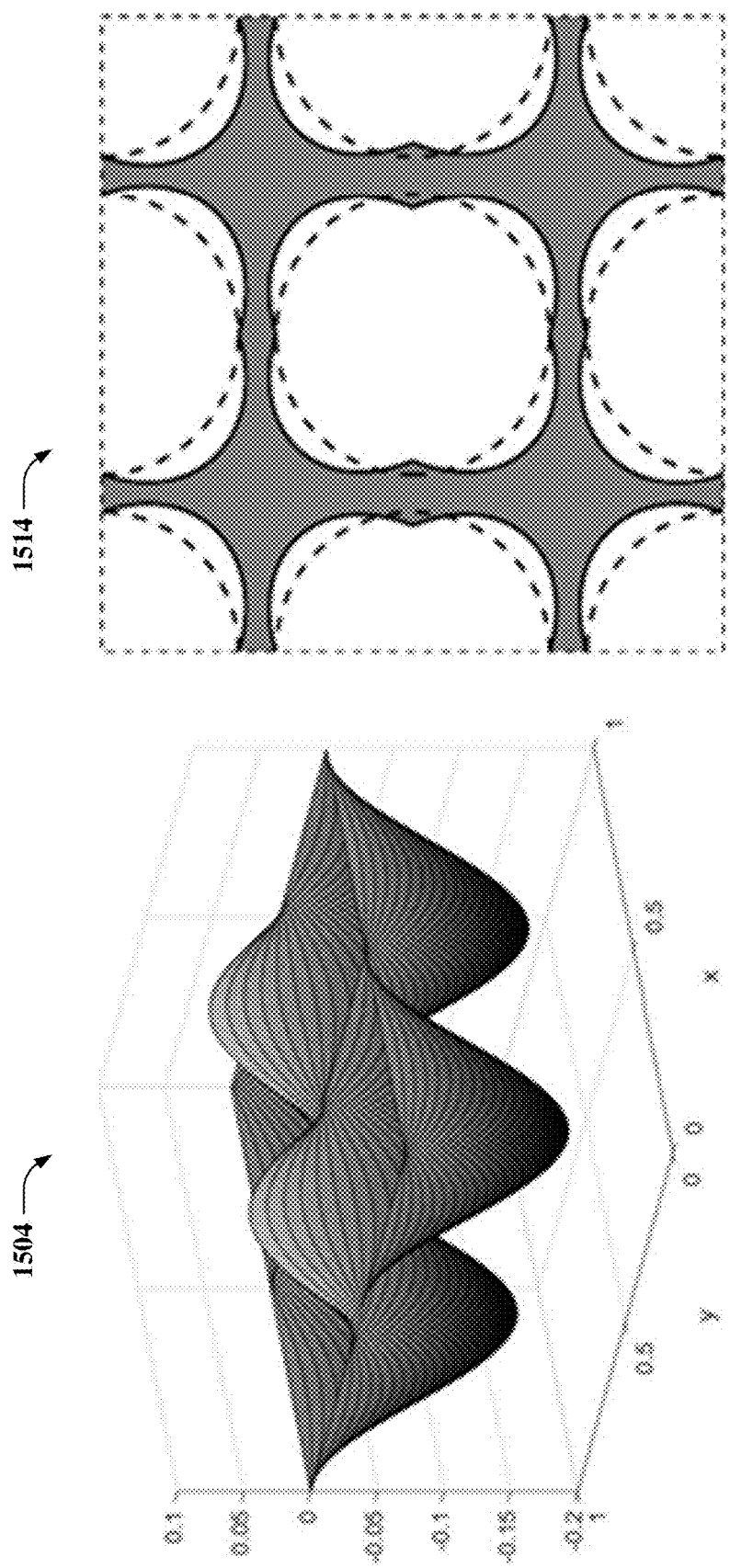
Figure 15D:
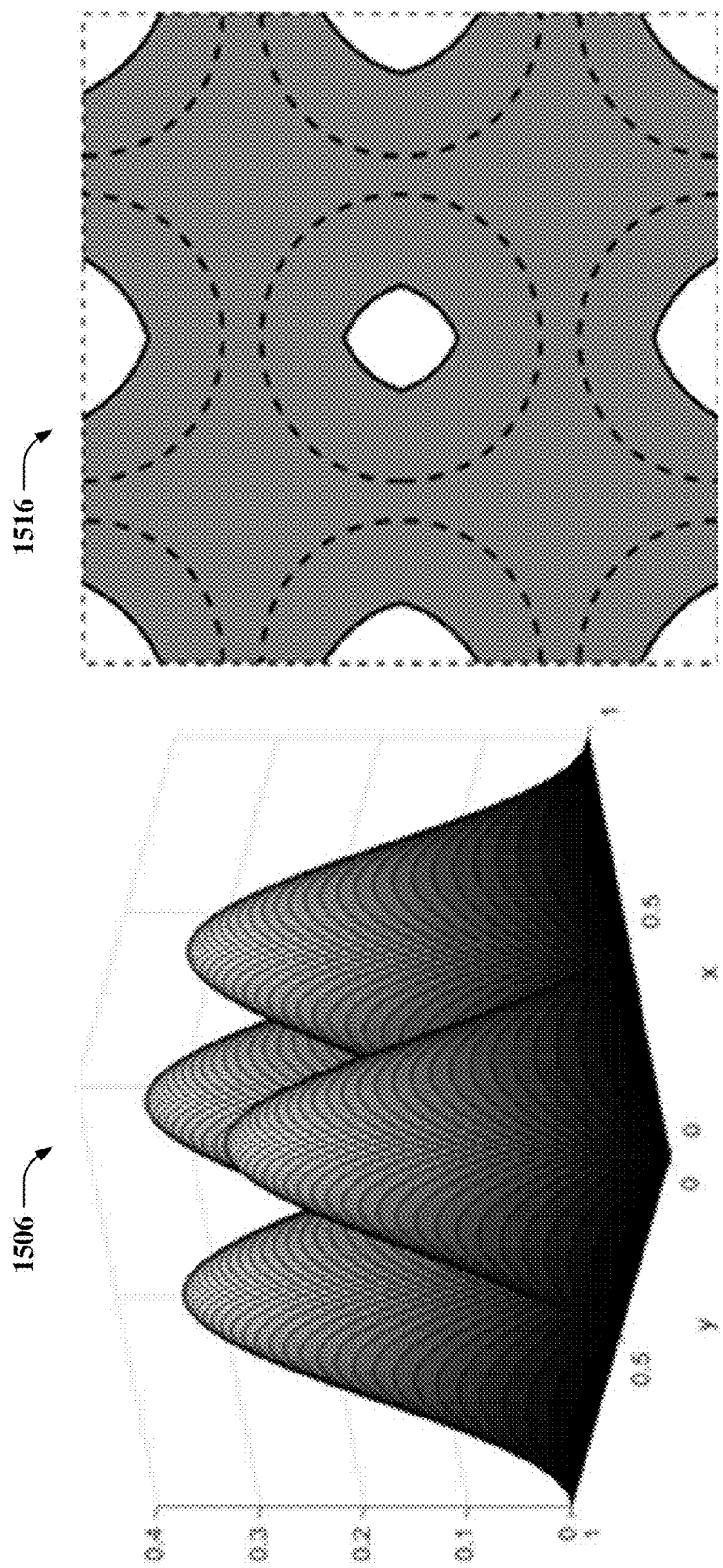

In the 2-D examples presented in FIGS. 15A, 15B, 15C and 15D, the geometric shaping effects are obtained by altering various combinations of the coefficients $c_{m,n}$ on the original base cell. Conclusions can be made in several aspects, including (1) different shape variations are realized by altering the coefficients, (2) directional variations can be achieved by an appropriate combination of the coefficients, such as changing a circle (FIG. 14A) into an ellipse (FIG. 15B), (3) thicker and thinner members can be simultaneously generated when including both positive and negative coefficients (FIG. 15C), and (4) an integrated effect of both offset and shape variations can be combined and realized (FIG. 15D).

Further, by augmenting a global cutting function $h_i(x)$ (Eq. (7)) to the base cell level-set function with geometric shaping $\phi_i(x)$, each microstructural cell $D_i$ of the constructed cellular structure is implicitly represented as follows:

$$f_i(x)=\phi(x)-g_i(x)-h_i(x)=\phi(x)-g_i(x)-\Sigma_{k=1}^{8}N_k(x)H_{i,k}=0,$$
$$x\in D_i \quad (13)$$

Figure 16:
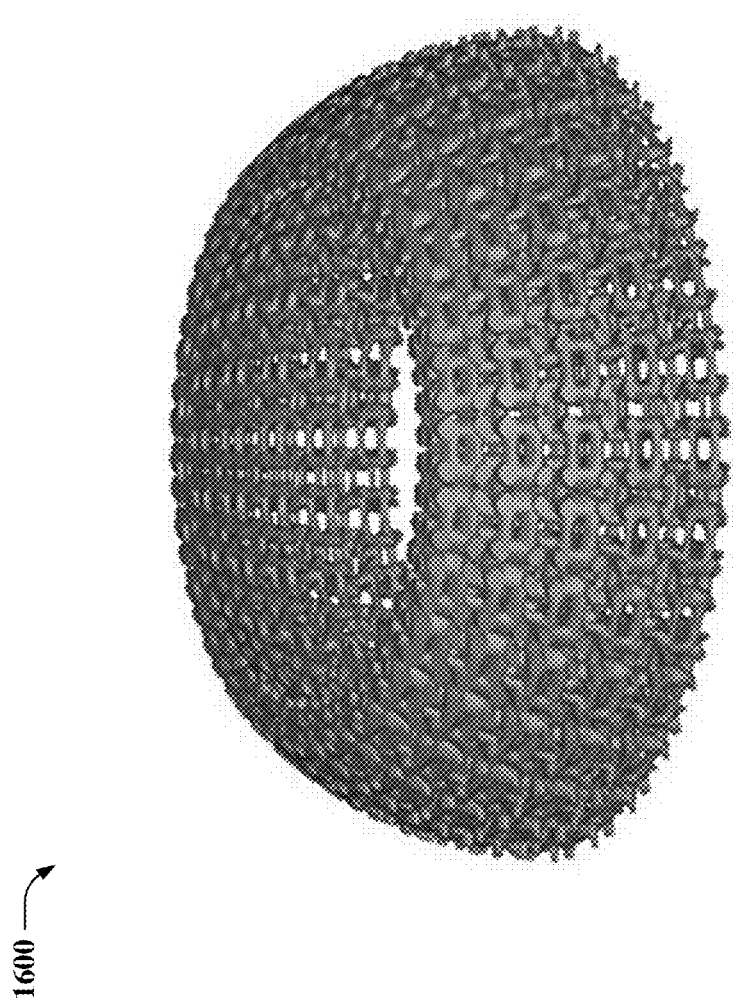
FIG. 16 shows an example of a cellular structure with variable and distributed negative Poisson's ratio, in accordance with an example embodiment.

FIG. 16 illustrates an example of a cellular structure 1600 built using the technique including the cell geometric shaping method and the global cutting technique in accordance with disclosed embodiments. As a result, the global geometry of the resulting cellular structure 1600 preserves at least $C^0$ continuity at the neighboring cell faces. The resulting structure has a special requirement that it offers a negative Poisson's ratio, as a variable and graded mechanical property across the cells in the resulting cellular structure.

Figure 17:
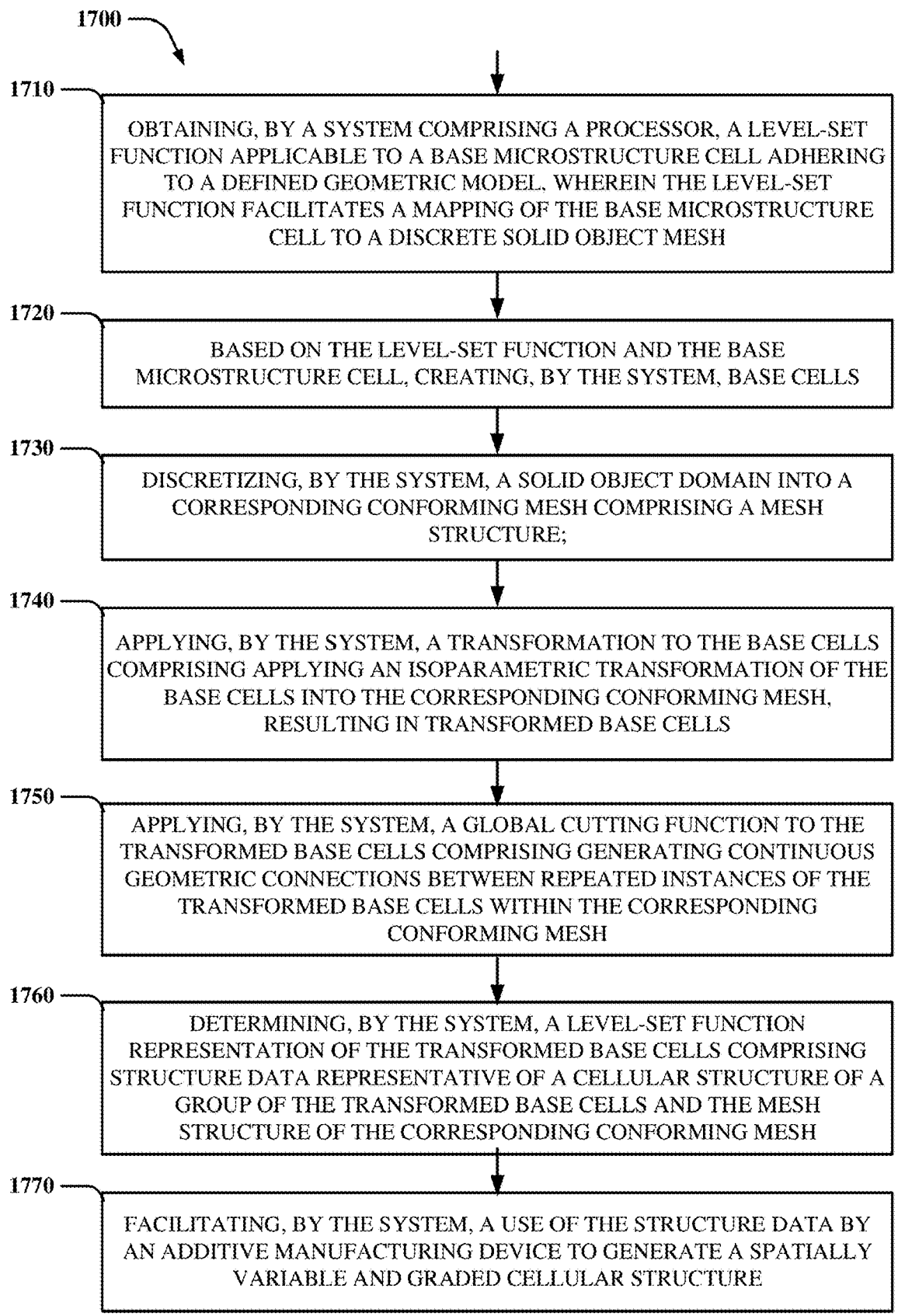
FIG. 17 depicts a flowchart of a process for modeling and designing conformal, variable, and graded cellular structures in three dimensions for additive manufacturing in accordance with example embodiments.

FIG. 17 depicts a flowchart 1700 of a process for modeling and designing conformal, variable, and graded cellular structures in three dimensions for additive manufacturing. At 1710, a method includes obtaining, by a system comprising a processor, a level-set function applicable to a base microstructure cell adhering to a defined geometric model, wherein the level-set function facilitates a mapping of the base microstructure cell to a discrete solid object mesh. Based on the level-set function and the base microstructure cell, base cells are created at 1720. The solid object domain is then discretized at 1730 into a corresponding conforming mesh comprising a mesh structure, and a transformation is applied at 1740 to the base cells comprising applying an isoparametric transformation of the base cells into the corresponding conforming mesh, resulting in transformed base cells. The computer-implemented method further includes, at 1750, applying a global cutting function to the transformed base cells comprising generating continuous geometric connections between repeated instances of the transformed base cells within the corresponding conforming mesh. Further, at 1760, a level-set function representation of the transformed base cells is determined, the level-set function representation comprising structure data representative of a cellular structure of a group of the transformed base cells and the mesh structure of the corresponding conforming mesh. At 1770, the computer-implemented method further includes facilitating a use of the structure data by an additive manufacturing device to generate a spatially variable and graded cellular structure.

The spatially variable and graded cellular structure can be at least one of a beam, a truss, a shell, or a solid. Where the transformed base cells are first transformed base cells, the applying can further comprise applying a cell-shaping function to the transformed base cells, prior to the applying the global cutting function.

In one embodiment, the global cutting function defines cut heights on mesh nodes of the corresponding conforming mesh and interpolates a cutting function to apply locally to the level-set function within each mesh element of the corresponding conforming mesh.

The level-set function can be a triply periodic function, wherein the base microstructure cell is representative of an analytical triply periodic function as a periodic surface model. The level-set function can also be a single-valued scaler function. In one embodiment, the base microstructure cell is defined as a unit cell and is represented in terms of an implicit field representation, and the base microstructure cell is replicable and defined as a zero-level set of the level-set function that is triply periodic within the unit cell.

Optionally, the applying the isoparametric transformation of the base cell can further comprise combining usage of a Cartesian coordinate system and a natural coordinate system, wherein the cellular structure is represented using the Cartesian coordinate system, and the base microstructure cell is represented within a standard cube using the natural coordinate system.

The discretizing of the solid object domain can comprise discretizing the solid object domain according to a uniform grid, wherein the level-set function is designated as a signed distance function, wherein function values at grid points of the uniform grid are evaluated, and wherein, based on a result of evaluation of the grid points, a continuous approximation within each grid element of the uniform grid is generated using a trilinear interpolation.

In another embodiment, the discretizing of the solid object domain comprises discretizing the solid object domain according to a uniform grid, wherein the level-set function is designated as a signed distance function, wherein function values at grid points of the uniform grid are evaluated, and wherein, based on a result of evaluation of the grid points, a continuous approximation within each grid element of the uniform grid is generated using a bilinear interpolation. The solid object domain can be discretized by a uniform grid with element length 1, the level-set function is designated as the signed distance function, and the function values at the grid points are evaluated, and a continuous approximation within each grid element is built through a higher order (higher than trilinear) interpolation.

The discretizing of the solid object domain can also comprise discretizing the solid object domain according to a grid, and wherein the global cutting function further comprises respective defined cutting heights for grid points or nodal points in a global coordinate system applicable to the grid.

The computer-implemented method can further include extracting the group of the transformed base cells that has been determined to fill the corresponding conforming mesh and storing the structure data representative of the cellular structure of the group of the transformed base cells and the mesh structure of the corresponding conforming mesh.

Figure 18:
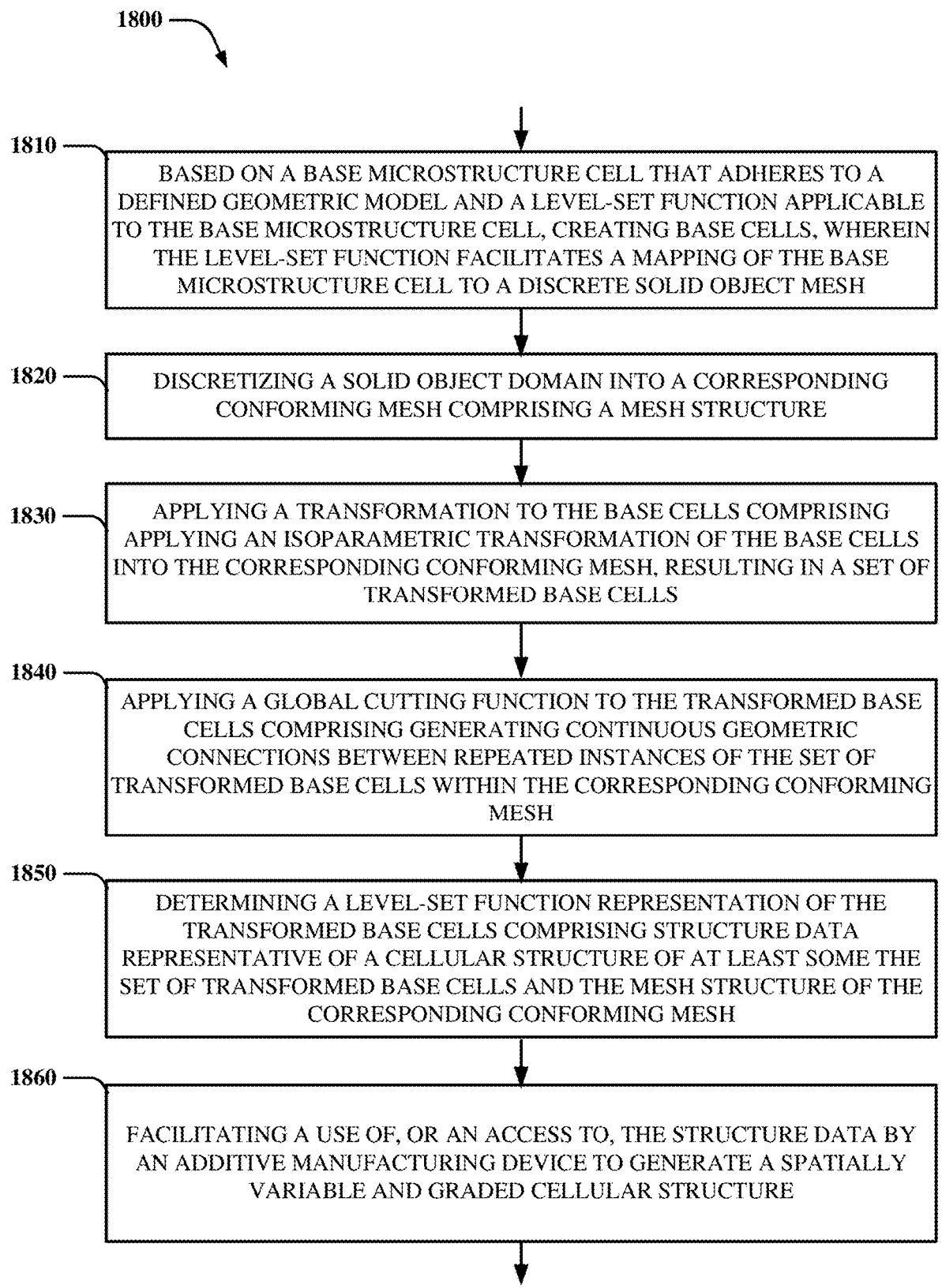
FIG. 18 illustrates a block diagram of an additive manufacturing device, in accordance with example embodiments.

FIG. 18 illustrates a block diagram of an additive manufacturing device comprising a processor communicatively coupled to a memory that stores executable instructions that, when executed by the processor, facilitate performance of operations to generate structure data for use to generate a spatially variable and graded cellular structure comprising any one or more of at least one of a beam, a truss, a shell, or a solid, in accordance with disclosed embodiments.

In one embodiment, an additive manufacturing device includes a processor, and a memory that stores executable instructions that, when executed by the processor, facilitate performance of operations 1800 to generate structure data for use to generate a spatially variable and graded cellular structure comprising any one or more of at least one of a beam, a truss, a shell, or a solid. The operations 1800 comprise at 1810, based on a base microstructure cell that adheres to a defined geometric model and a level-set function applicable to the base microstructure cell, creating base cells, wherein the level-set function facilitates a mapping of the base microstructure cell to a discrete solid object mesh. The operations further comprise at 1820, discretizing a solid object domain into a corresponding conforming mesh comprising a mesh structure and, at 1830, applying a transformation to the base cells comprising applying an isoparametric transformation of the base cells into the corresponding conforming mesh, resulting in a set of transformed base cells.

Further, the operations comprise at 1840 applying a global cutting function to the transformed base cells comprising generating continuous geometric connections between repeated instances of the set of transformed base cells within the corresponding conforming mesh. Additionally, at 1850, the operations comprise determining a level-set function representation of the transformed base cells comprising structure data representative of a cellular structure of at least some the set of transformed base cells and the mesh structure of the corresponding conforming mesh and facilitating a use of, or an access to, the structure data by an additive manufacturing device to generate a spatially variable and graded cellular structure.

In an embodiment, the solid object domain can be a unit-sized three-dimensional (3-D) cube, wherein the geometric model is an implicit representation model, and wherein the corresponding conforming mesh is a body-fitted hexahedron mesh. The solid object domain can be a unit-sized two-dimensional (2-D) square, wherein the geometric model is an implicit representation model, and wherein the corresponding conforming mesh is a body-fitted quadrilateral mesh.

Figure 19:
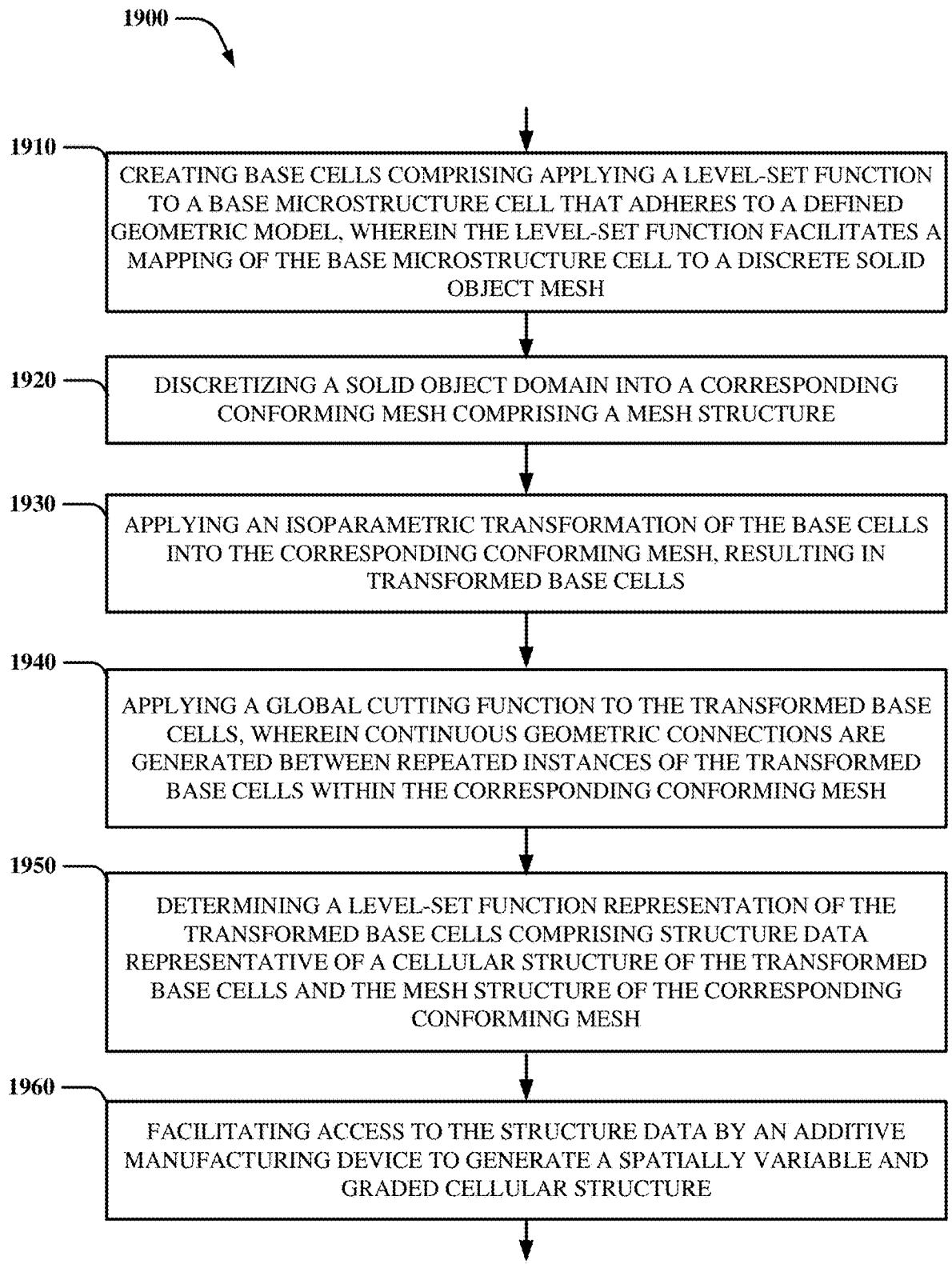
FIG. 19 illustrates a block diagram of a machine readable storage medium, in accordance with example embodiments.

FIG. 19 illustrates a block diagram of a machine readable storage medium comprising executable instructions that, when executed by a processor, facilitate performance of operations 1900 comprising, at 1910, creating base cells comprising applying a level-set function to a base microstructure cell that adheres to a defined geometric model, wherein the level-set function facilitates a mapping of the base microstructure cell to a discrete solid object mesh. At 1920, the operations 1900 can include discretizing a solid object domain into a corresponding conforming mesh comprising a mesh structure. At 1930, the operations 1900 can include applying an isoparametric transformation of the base cells into the corresponding conforming mesh, resulting in transformed base cells. At 1940, the operations 1900 can include applying a global cutting function to the transformed base cells, wherein continuous geometric connections are generated between repeated instances of the transformed base cells within the corresponding conforming mesh. At 1950, the operations 1900 can include determining a level-set function representation of the transformed base cells comprising structure data representative of a cellular structure of the transformed base cells and the mesh structure of the corresponding conforming mesh, and, at 1960, operations 1900 can include facilitating access to the structure data by an additive manufacturing device to generate a spatially variable and graded cellular structure, in accordance with disclosed embodiments.

Those skilled in the art will recognize that, unless specifically indicated or required by the sequence of operations, certain steps in the processes described above may be omitted, performed concurrently or sequentially, or performed in a different order.

Although an exemplary embodiment of the present disclosure has been described in detail, those skilled in the art will understand that various changes, substitutions, variations, and improvements disclosed herein may be made without departing from the spirit and scope of the disclosure in its broadest form.

Figure 20:
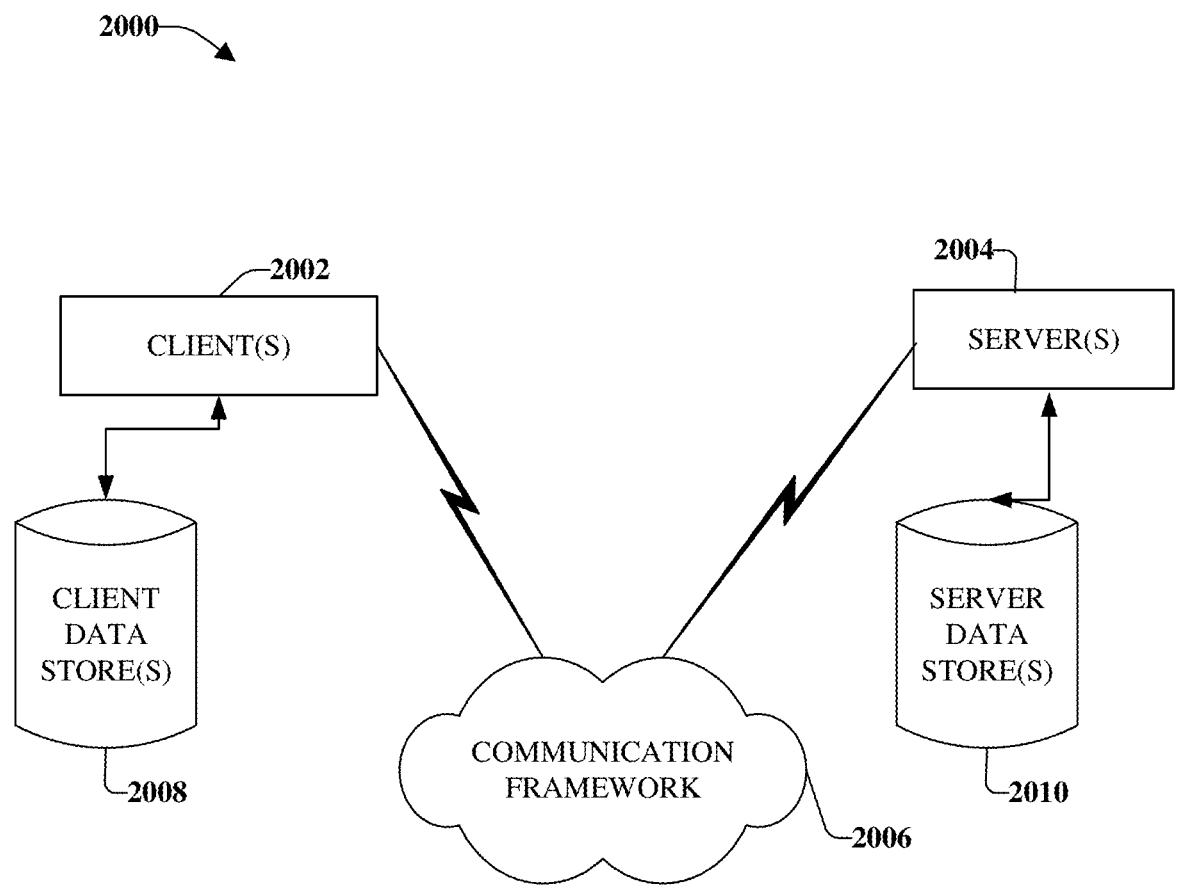
FIG. 20 illustrates an example schematic block diagram of a computing environment in accordance various aspects of this disclosure.

Referring now to FIG. 20, there is illustrated a schematic block diagram of a computing environment 2000 in accordance with this specification. The system 2000 includes one or more client(s) 2002, (e.g., computers, smart phones, tablets, cameras, PDA's). The client(s) 2002 can be hardware and/or software (e.g., threads, processes, computing devices). The client(s) 2002 can house cookie(s) and/or associated contextual information by employing the specification, for example.

The system 2000 also includes one or more server(s) 2004. The server(s) 2004 can also be hardware or hardware in combination with software (e.g., threads, processes, computing devices). The servers 2004 can house threads to perform transformations by employing aspects of this disclosure, for example. One possible communication between a client 2002 and a server 2004 can be in the form of a data packet adapted to be transmitted between two or more computer processes wherein data packets may include coded items. The data packet can include a cookie and/or associated contextual information, for example. The system 2000 includes a communication framework 2006 (e.g., a global communication network such as the Internet) that can be employed to facilitate communications between the client(s) 2002 and the server(s) 2004.

Communications can be facilitated via a wired (including optical fiber) and/or wireless technology. In an aspect, communications between client(s) 2002 and network devices (e.g., server(s) 2004) are through wireless channels. In another aspect, communication links between network devices (e.g., servers(s) 2004) can be via wireless and/or wired channels. It is noted that wireless connections between client(s) 2002 and network devices (e.g., server(s) 2004) are described herein, however client(s) 2002 may have other capabilities (e.g., wired communications capabilities). The client(s) 2002 are operatively connected to one or more client data store(s) 2008 that can be employed to store information local to the client(s) 2002 (e.g., cookie(s) and/or associated contextual information). Similarly, the server(s) 2004 are operatively connected to one or more server data store(s) 2010 that can be employed to store information local to the servers 2004.

In one implementation, a server 2004 can transfer an encoded file, (e.g., network selection policy, network condition information, etc.), to client 2002. Client 2002 can store the file, decode the file, or transmit the file to another client 2002. It is noted, that a server 2004 can also transfer uncompressed file to a client 2002 and client 2002 can compress the file in accordance with the disclosed subject matter. Likewise, server 2004 can encode information and transmit the information via communication framework 2006 to one or more clients 2002.

Referring now to FIG. 16, there is illustrated a block diagram of a computer operable to execute the disclosed communication architecture. In order to provide additional context for various aspects of the subject specification, FIG. 16 and the following discussion are intended to provide a brief, general description of a suitable computing environment 1600 in which the various aspects of the specification can be implemented. While the specification has been described above in the general context of computer-executable instructions that can run on one or more computers, it is noted that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the specification can also be practiced in distributed computing environments, including cloud-computing environments, where certain tasks are performed by remote processing devices that are linked through a communications network. In a distributed computing environment, program modules can be located in both local and remote memory storage devices.

Computing devices can include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically include (and/or facilitate the transmission of) computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communications media include wired media, such as a wired network or direct-wired connection, and wireless media such as acoustic, RF, infrared and other wireless media.

Figure 21:
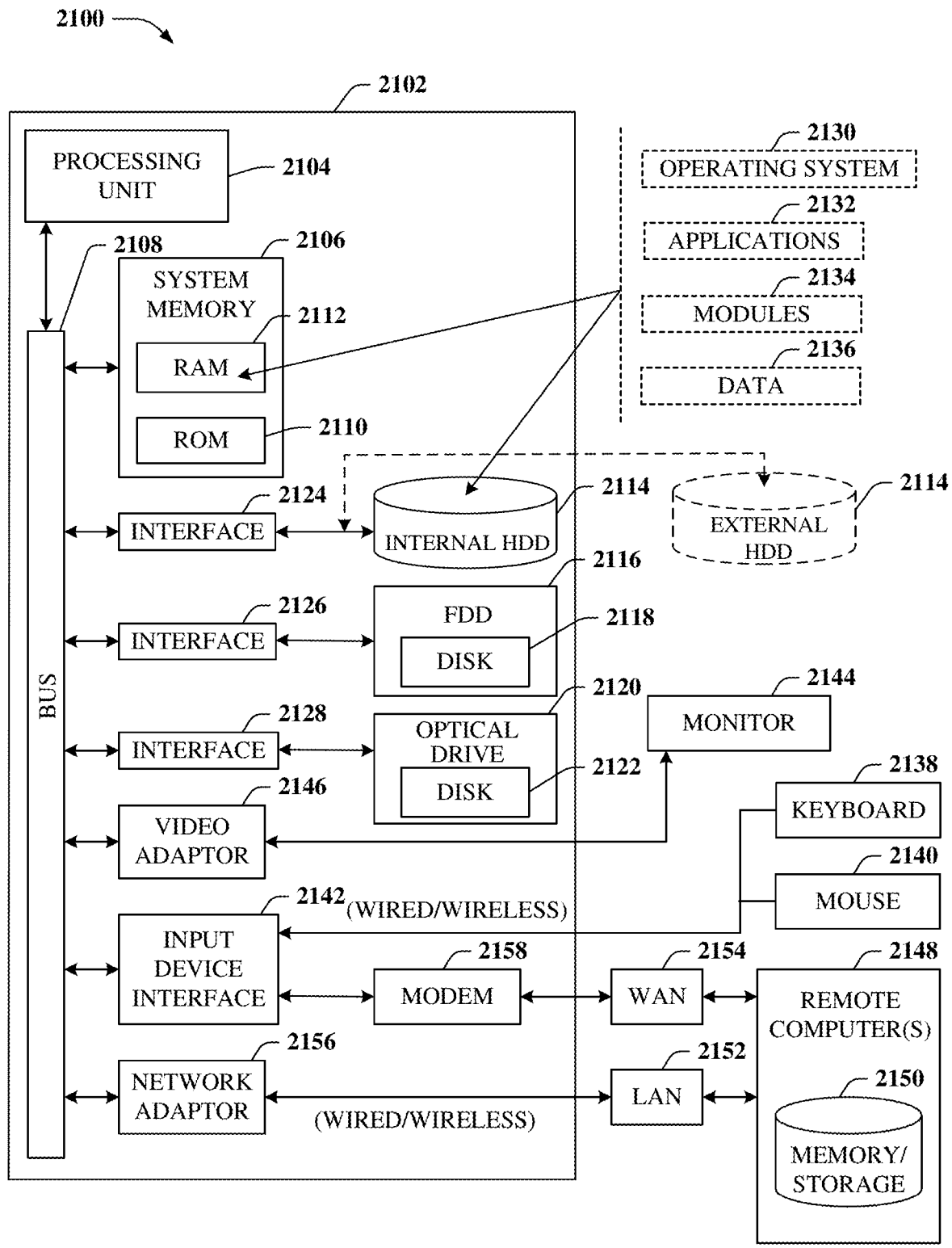
FIG. 21 illustrates a block diagram of a computer operable to execute the disclosed communication architecture.

With reference again to FIG. 21, the example environment 2100 for implementing various aspects of the specification includes a computer 2102, the computer 2102 including a processing unit 2104, a system memory 2106 and a system bus 2108. The system bus 2108 couples system components including, but not limited to, the system memory 2106 to the processing unit 2104. The processing unit 2104 can be any of various commercially available processors. Dual microprocessors and other multi-processor architectures can also be employed as the processing unit 2104.

The system bus 2108 can be any of several types of bus structure that can further interconnect to a memory bus (with or without a memory controller), a peripheral bus, and a local bus using any of a variety of commercially available bus architectures. The system memory 2106 includes read-only memory (ROM) 2110 and random access memory (RAM) 2112. A basic input/output system is stored in a non-volatile memory 2110 such as ROM, erasable programmable read only memory, electrically erasable programmable read only memory, which basic input/output system contains the basic routines that help to transfer information between elements within the computer 2102, such as during startup. The RAM 2112 can also include a high-speed RAM such as static RAM for caching data.

The computer 2102 further includes an internal hard disk drive 2114 (e.g., EIDE, SATA), which internal hard disk drive 2114 can also be configured for external use in a suitable chassis (not shown), a magnetic floppy disk drive 2116, (e.g., to read from or write to a removable diskette 2118) and an optical disk drive 2120, (e.g., reading a CD-ROM disk 2122 or, to read from or write to other high capacity optical media such as the DVD). The hard disk drive 2114, magnetic disk drive 2116 and optical disk drive 2120 can be connected to the system bus 2108 by a hard disk drive interface 2124, a magnetic disk drive interface 2126 and an optical drive interface 2128, respectively. The interface 2124 for external drive implementations includes at least one or both of Universal Serial Bus (USB) and IEEE 1394 interface technologies. Other external drive connection technologies are within contemplation of the subject specification.

The drives and their associated computer-readable storage media provide nonvolatile storage of data, data structures, computer-executable instructions, and so forth. For the computer 2102, the drives and storage media accommodate the storage of any data in a suitable digital format. Although the description of computer-readable storage media above refers to a HDD, a removable magnetic diskette, and a removable optical media such as a CD or DVD, it should be noted by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods of the specification.

A number of program modules can be stored in the drives and RAM 2112, including an operating system 2130, one or more application programs 2132, other program modules 2134 and program data 2136. All or portions of the operating system, applications, modules, and/or data can also be cached in the RAM 2112. It is noted that the specification can be implemented with various commercially available operating systems or combinations of operating systems.

A user can enter commands and information into the computer 2102 through one or more wired/wireless input devices, e.g., a keyboard 2138 and a pointing device, such as a mouse 2140. Other input devices (not shown) can include a microphone, an IR remote control, a joystick, a game pad, a stylus pen, touch screen, or the like. These and other input devices are often connected to the processing unit 2104 through an input device interface 2142 that is coupled to the system bus 2108, but can be connected by other interfaces, such as a parallel port, an IEEE 1394 serial port, a game port, a USB port, an IR interface, etc.

A monitor 2144 or other type of display device is also connected to the system bus 2108 via an interface, such as a video adapter 2146. In addition to the monitor 2144, a computer typically includes other peripheral output devices (not shown), such as speakers, printers, etc.

The computer 2102 can operate in a networked environment using logical connections via wired and/or wireless communications to one or more remote computers, such as a remote computer(s) 2148. The remote computer(s) 2148 can be a workstation, a server computer, a router, a personal computer, portable computer, microprocessor-based entertainment appliance, a peer device or other common network node, and typically includes many or all of the elements described relative to the computer 2102, although, for purposes of brevity, only a memory/storage device 2150 is illustrated. The logical connections depicted include wired/wireless connectivity to a local area network 2152 and/or larger networks, e.g., a wide area network 2154. Such local area network and wide area network networking environments are commonplace in offices and companies, and facilitate enterprise-wide computer networks, such as intranets, all of which can connect to a global communications network, e.g., the Internet.

When used in a local area network networking environment, the computer 2102 is connected to the local network 2152 through a wired and/or wireless communication network interface or adapter 2156. The adapter 2156 can facilitate wired or wireless communication to the local area network 2152, which can also include a wireless access point disposed thereon for communicating with the wireless adapter 2156.

When used in a wide area network environment, the computer 2102 can include a modem 2158, or is connected to a communications server on the wide area network 2154, or has other means for establishing communications over the wide area network 2154, such as by way of the Internet. The modem 2158, which can be internal or external and a wired or wireless device, is connected to the system bus 2108 via the serial port interface 2142. In a networked environment, program modules depicted relative to the computer 2102, or portions thereof, can be stored in the remote memory/storage device 2150. It is noted that the network connections shown are example and other means of establishing a communications link between the computers can be used.

The computer 2102 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. In an example embodiment, wireless communications can be facilitated, for example, using Wi-Fi, Bluetooth™, Zigbee, and other 802.XX wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE 802.3 or Ethernet). Wi-Fi networks can operate in the unlicensed 2.4 and 5 GHz radio bands, at an 12 Mbps (802.11a), 54 Mbps (802.11b), or 150 Mbps (802.11n) data rate, for example, or with products that contain both bands (dual band), so the networks can provide real-world performance similar to wired Ethernet networks used in many homes and/or offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In the subject specification, terms such as "data store," data storage," "database," and substantially any other information storage component relevant to operation and functionality of a component, refer to "memory components," or entities embodied in a "memory" or components comprising the memory. It is noted that the memory components, or computer-readable storage media, described herein can be either volatile memory(s) or nonvolatile memory(s), or can include both volatile and nonvolatile memory(s).

By way of illustration, and not limitation, nonvolatile memory(s) can include read only memory (ROM), programmable ROM (PROM), electrically programmable ROM (EPROM), electrically erasable ROM (EEPROM), or flash memory. Volatile memory(s) can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

As used in this application, the terms "component," "module," "system," "interface," "platform," "service," "framework," "connector," "controller," or the like are generally intended to refer to a computer-related entity, either hardware, a combination of hardware and software, software, or software in execution or an entity related to an operational machine with one or more specific functionalities. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. As another example, an interface can include I/O components as well as associated processor, application, and/or API components.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

What has been described above includes examples of the present specification. It is, of course, not possible to describe every conceivable combination of components or methodologies for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method, comprising:
    obtaining, by a system comprising a processor, a level-set function applicable to a base microstructure cell adhering to a defined geometric model, wherein the level-set function facilitates a mapping of the base microstructure cell to a discrete solid object mesh;
    based on the level-set function and the base microstructure cell, creating, by the system, base cells;
    discretizing, by the system, a solid object domain into a corresponding conforming mesh comprising a mesh structure;
    applying, by the system, a transformation to the base cells comprising applying an isoparametric transformation of the base cells into the corresponding conforming mesh, resulting in transformed base cells;
    applying, by the system, a global cutting function to the transformed base cells comprising generating continuous geometric connections between repeated instances of the transformed base cells within the corresponding conforming mesh;
    determining, by the system, a level-set function representation of the transformed base cells comprising structure data representative of a cellular structure of a group of the transformed base cells and the mesh structure of the corresponding conforming mesh; and
    facilitating, by the system, a use of the structure data by an additive manufacturing device to generate a spatially variable and graded cellular structure.

2. The method of claim 1, wherein the spatially variable and graded cellular structure is at least one of a beam, a truss, a shell, or a solid.

3. The method of claim 1, wherein the transformed base cells are first transformed base cells, and wherein the applying further comprises applying, by the system, a cell-shaping function to the transformed base cells, prior to the applying the global cutting function.

4. The method of claim 1, wherein the global cutting function defines cut heights on mesh nodes of the corresponding conforming mesh and interpolates a cutting function to apply locally to the level-set function within each mesh element of the corresponding conforming mesh.

5. The method of claim 1, wherein the level-set function is a triply periodic function, and wherein the base microstructure cell is representative of an analytical triply periodic function as a periodic surface model.

6. The method of claim 1, wherein the base microstructure cell is defined as a unit cell and is represented in terms of an implicit field representation, and wherein the base microstructure cell is replicable and defined as a zero-level set of the level-set function that is triply periodic within the unit cell.

7. The method of claim 1, wherein the applying the isoparametric transformation of the base cell further comprises:
combining usage of a Cartesian coordinate system and a natural coordinate system, wherein the cellular structure is represented using the Cartesian coordinate system, and the base microstructure cell is represented within a standard cube using the natural coordinate system.

8. The method of claim 1, wherein the level-set function is a single-valued scaler function.

9. The method of claim 1, wherein the discretizing of the solid object domain comprises discretizing the solid object domain according to a uniform grid, wherein the level-set function is designated as a signed distance function, wherein function values at grid points of the uniform grid are evaluated, and wherein, based on a result of evaluation of the grid points, a continuous approximation within each grid element of the uniform grid is generated using a trilinear interpolation.

10. The method of claim 1, wherein the discretizing of the solid object domain comprises discretizing the solid object domain according to a uniform grid, wherein the level-set function is designated as a signed distance function, wherein function values at grid points of the uniform grid are evaluated, and wherein, based on a result of evaluation of the grid points, a continuous approximation within each grid element of the uniform grid is generated using a bilinear interpolation.

11. The method of claim 1, wherein the solid object domain is discretized by a uniform grid with element length 1, the level-set function is designated as the signed distance function, and the function values at the grid points are evaluated, and a continuous approximation within each grid element is via an interpolation of an order higher than trilinear interpolation.

12. The method of claim 1, wherein the discretizing of the solid object domain comprises discretizing the solid object domain according to a grid, and wherein the global cutting function further comprises respective defined cutting heights for grid points or nodal points in a global coordinate system applicable to the grid.

13. The method of claim 1, further comprising:
extracting, by the system, the group of the transformed base cells that has been determined to fill the corresponding conforming mesh; and
storing, by the system, the structure data representative of the cellular structure of the group of the transformed base cells and the mesh structure of the corresponding conforming mesh.

14. An additive manufacturing device, comprising:
a processor; and
a memory that stores executable instructions that, when executed by the processor, facilitate performance of operations to generate structure data for use to generate a spatially variable and graded cellular structure comprising any one or more of at least one of a beam, a truss, a shell, or a solid, the operations comprising:
based on a base microstructure cell that adheres to a defined geometric model and a level-set function applicable to the base microstructure cell, creating base cells, wherein the level-set function facilitates a mapping of the base microstructure cell to a discrete solid object mesh;
discretizing a solid object domain into a corresponding conforming mesh comprising a mesh structure;
applying a transformation to the base cells comprising applying an isoparametric transformation of the base cells into the corresponding conforming mesh, resulting in a set of transformed base cells;
applying a global cutting function to the transformed base cells comprising generating continuous geometric connections between repeated instances of the set of transformed base cells within the corresponding conforming mesh; and
determining a level-set function representation of the transformed base cells comprising structure data representative of a cellular structure of at least some the set of transformed base cells and the mesh structure of the corresponding conforming mesh; and
facilitating a use of, or an access to, the structure data by an additive manufacturing device to generate a spatially variable and graded cellular structure.

15. The additive manufacturing device of claim 14, wherein the solid object domain is a unit-sized three-dimensional (3-D) cube, wherein the geometric model is an implicit representation model, and wherein the corresponding conforming mesh is a body-fitted hexahedron mesh.

16. The additive manufacturing device of claim 14, wherein the solid object domain is a unit-sized two-dimensional (2-D) square, wherein the geometric model is an implicit representation model, and wherein the corresponding conforming mesh is a body-fitted quadrilateral mesh.

17. A non-transitory machine-readable medium, comprising executable instructions that, when executed by a processor, facilitate performance of operations, comprising:
creating base cells comprising applying a level-set function to a base microstructure cell that adheres to a defined geometric model, wherein the level-set function facilitates a mapping of the base microstructure cell to a discrete solid object mesh;
discretizing a solid object domain into a corresponding conforming mesh comprising a mesh structure;
applying an isoparametric transformation of the base cells into the corresponding conforming mesh, resulting in transformed base cells;
applying a global cutting function to the transformed base cells, wherein continuous geometric connections are generated between repeated instances of the transformed base cells within the corresponding conforming mesh;
determining a level-set function representation of the transformed base cells comprising structure data representative of a cellular structure of the transformed base cells and the mesh structure of the corresponding conforming mesh; and
facilitating access to the structure data by an additive manufacturing device to generate a spatially variable and graded cellular structure.

18. The non-transitory machine-readable medium of claim 17, wherein the geometric model of the base microstructure cell is a feature-based geometric model.

19. The non-transitory machine-readable medium of claim 17, wherein the geometric model of the base microstructure cell is an implicit function-based geometric model.

20. The non-transitory machine-readable medium of claim 17, wherein the geometric model of the base microstructure cell is a mesh-based geometric model.

* * * * *